(12) United States Patent
Hulscher

(10) Patent No.: US 11,791,587 B2
(45) Date of Patent: Oct. 17, 2023

(54) APPARATUS AND METHODS FOR CONTACT INSERTION AND RETENTION TESTING

(71) Applicant: The Boeing Company, Chicago, IL (US)

(72) Inventor: Mark E. Hulscher, Seattle, WA (US)

(73) Assignee: The Boeing Company, Arlington, VA (US)

(*) Notice: Subject to any disclaimer, the term of this patent is extended or adjusted under 35 U.S.C. 154(b) by 44 days.

(21) Appl. No.: 17/459,859

(22) Filed: Aug. 27, 2021

(65) Prior Publication Data

US 2021/0391667 A1    Dec. 16, 2021

Related U.S. Application Data

(62) Division of application No. 16/224,853, filed on Dec. 19, 2018, now Pat. No. 11,128,086.

(Continued)

(51) Int. Cl.
*H01R 13/52* (2006.01)
*H01R 11/18* (2006.01)
*H01R 11/00* (2006.01)

(52) U.S. Cl.
CPC ........... *H01R 13/521* (2013.01); *H01R 11/00* (2013.01); *H01R 11/18* (2013.01); *H01R 13/5205* (2013.01); *H01R 13/5219* (2013.01)

(58) Field of Classification Search
CPC ...... H01R 11/00; H01R 11/18; H01R 13/521; H01R 13/5205; H01R 13/5219; G01R 31/69; G01R 1/0408; G01R 1/06794
See application file for complete search history.

(56) References Cited

U.S. PATENT DOCUMENTS 5,670,884 A * 9/1997 Kodama ............... G01R 31/69
439/489
5,689,191 A * 11/1997 Kashiyama ............ G01R 31/69
439/489

(Continued)

FOREIGN PATENT DOCUMENTS

EP    1073164 A1 *   1/2001    ............. G01R 1/073

OTHER PUBLICATIONS

Japanese Office Action dated Jan. 30, 2023 in Japanese Patent Application No. 2019-045713 (Japanese counterpart of the parent of the instant U.S. divisional application).

*Primary Examiner* — Jeffrey T Carley
(74) *Attorney, Agent, or Firm* — Ostrager Chong Flaherty & Broitman P.C.

(57) ABSTRACT

Apparatus and methods for inserting and retention testing an electrically conductive contact in an electrical connector. The method includes the following steps: manually partially inserting the contact into a hole formed inside the electrical connector; inserting the contact further into the hole by pushing the contact along an axis using an insertion tip that is aligned with the axis and that displaces in a first direction along the axis during inserting; and after inserting the contact further into the hole, testing retention of the contact inside the electrical connector by pushing the contact along the axis using a test probe that is aligned with the axis and that displaces in a second direction opposite to the first direction during retention testing. The force exerted by the test probe on the contact is less than a specified contact retention force. The method further includes generating an alert signal if the test probe displaces along the axis in the second direction by more than a specified distance during retention testing.

10 Claims, 25 Drawing Sheets

Related U.S. Application Data

(60) Provisional application No. 62/670,343, filed on May 11, 2018.

(56) References Cited

U.S. PATENT DOCUMENTS

| | | | | |
|---|---|---|---|---|
| 6,087,839 A * | 7/2000 | Choi | G01R 31/2806 | 324/763.01 |
| 6,359,452 B1 * | 3/2002 | Mozzetta | G01R 1/0408 | 324/750.25 |
| 6,731,118 B2 * | 5/2004 | Nishino | G01R 31/69 | 324/538 |
| 7,301,356 B2 * | 11/2007 | Machado | G01R 31/2808 | 324/750.16 |
| 7,511,505 B1 * | 3/2009 | Bailey | H05K 7/207 | 340/638 |
| 8,099,857 B2 * | 1/2012 | Shelley | H01R 43/20 | 29/709 |
| 8,375,804 B2 * | 2/2013 | Su | G01N 19/04 | 73/842 |
| 8,525,525 B2 * | 9/2013 | Sugiyama | G01R 31/66 | 324/750.16 |
| 8,816,696 B2 * | 8/2014 | Kogasumi | G01R 31/69 | 438/137 |
| 9,385,473 B2 * | 7/2016 | Iwatani | H01R 13/6295 | |
| 9,395,400 B1 * | 7/2016 | Islam | G01R 31/66 | |
| 11,128,086 B2 * | 9/2021 | Hulscher | G01R 31/69 | |
| 2004/0201392 A1 * | 10/2004 | Kim | G01R 3/00 | 324/750.23 |
| 2007/0024305 A1 * | 2/2007 | Kim | G01R 1/06794 | 324/750.01 |
| 2007/0264849 A1 * | 11/2007 | Steckler | G01R 31/69 | 29/721 |
| 2011/0221461 A1 * | 9/2011 | Kanev | G01R 31/319 | 324/750.03 |
| 2015/0168479 A1 * | 6/2015 | Gutierrez Martinez | G01R 31/69 | 324/538 |
| 2017/0261405 A1 * | 9/2017 | Estevo | G01M 99/007 | |

* cited by examiner

APPARATUS AND METHODS FOR CONTACT INSERTION AND RETENTION TESTING

RELATED PATENT APPLICATIONS

This application is a divisional of and claims priority from U.S. patent application Ser. No. 16/224,853 filed on Dec. 19, 2018, issued as U.S. Pat. No. 11,128,086 on Sep. 21, 2023, which claims the benefit, under Title 35, United States Code, § 119(e), of U.S. Provisional Application No. 62/670,343 filed on May 11, 2018, the disclosure of which is incorporated by reference herein in its entirety.

BACKGROUND

The present disclosure generally systems and methods for assembling a wire bundle in which each wire terminates at a respective electrically conductive contact. In particular, this disclosure relates to systems and methods for inserting such contacts into electrical connectors.

A connector is generally mounted upon the end portions of a plurality of conductors, such as optical fibers, electrically conductive wires or the like. In some implementations, the connector is mated with another connector to connect respective bundles of the conductors. In alternative implementations, the connector is connected to a receptacle of an instrument or the like.

It is conventional for each connector to comprise a mating shell which is mechanically connected to the shell of the other connector when the two connectors are brought into operative relationship. Each connector also includes a contact-receiving insert. The insert is typically made of dielectric material and is in the form of a plate having an inner surface which confronts the corresponding insert of the other connector, and an opposite, outer surface which is parallel to the inner surface. Numerous holes penetrate this member, opening at their opposite ends at the inner and outer surfaces respectively of the insert.

In instances in which the conductor is a wire, the wire is prepared for attachment to the connector by stripping the electrically insulative jacket from the end of the wire so as to expose the conductive core, and crimping a contact onto the conductor. This contact is in the form of a pin or a receptacle (referred to hereinafter as a "socket"). The contact is introduced into a hole in the aforementioned insert by way of the outer surface thereof and, in the case of a pin, projects beyond the inner surface of the insert. When all the wires have been attached to respective connectors and the connectors are brought into mating relationship, the contacts that are received in the holes of one insert are physically engaged by the contacts that are received in the holes of the other insert. Thus, the connectors typically do not have pins or receptacles other than those that are physically attached to the wires before introduction into the holes of the insulating insert.

When attaching a bundle or breakout of conductors from a wiring harness or the like to a connector, it is necessary to ensure that the conductors are located in the proper holes of the insert, since otherwise the proper circuits will not be completed when the connector is coupled to its mating connector.

A further problem is that a contact may be incompletely inserted or otherwise improperly seated in a hole of the insert. If a contact is improperly seated, it is possible that the retention force exerted by the retention clips inside the connector may be insufficient to retain the pin or socket in contact with a corresponding socket or pin if the wire to which the pin or socket is attached is pulled with sufficient force or if the connectors are shaken, for example, by vibrations.

Despite the existence of several testing methods and mechanisms to limit the occurrence of unseated or improperly seated contacts, it is still difficult to identify cases when contacts are barely touching but still able to pass an electrical continuity test, yet would easily disconnect when the connection has been shaken, for example. Current wire connection installation mechanisms are mainly manual, relying on the force exerted by the operator to insert wires properly into the connector. As such, consistency is unattainable and often either too much force is exerted to a point that causes damage to the connector or too little force to a point that a tenuous connection is disconnected.

Similarly, testing for unseated or improperly seated contacts is usually manual. During a manual operation performed by a technician or inspector, the person can either pull on a wire or push on a contact to test retention. Similar issues regarding inconsistent results arise during manual retention testing. Since there is no way for an operator to gage the pulling or pushing force being applied, too little force may result in a faulty test and too much force may again cause damage to the wire or the connector.

Inserting wires properly while reducing unseated contact occurrences is needed for the electrical industry across multiple sectors. In the particular scenario where bundles of wires are to be handled, a solution is needed for both ends of the bundles. A solution that would enable predefined consistent quality testing is needed to address the problem of unseated contacts in wire bundle assemblies.

SUMMARY

The subject matter disclosed herein is directed to an apparatus and methods for inserting and retention testing an electrically conductive contact in an electrical connector. The method includes the following steps: manually partially inserting the contact into a hole formed inside the electrical connector; inserting the contact further into the hole by pushing the contact along an axis using an insertion tip that is aligned with the axis and that displaces in a first direction along the axis during inserting; and after inserting the contact further into the hole, testing retention of the contact inside the electrical connector by pushing the contact along the axis using a test probe that is aligned with the axis and that displaces in a second direction opposite to the first direction during retention testing. The force exerted by the test probe on the contact is less than a specified contact retention force. The method further includes generating an alert signal if the test probe displaces along the axis in the second direction by more than a specified distance during retention testing.

Although various embodiments of apparatus and methods for inserting and retention testing an electrically conductive contact in an electrical connector will be described in some detail below, one or more of those embodiments is characterized by one or more of the following aspects.

One aspect of the subject matter disclosed in detail below is a method for inserting and retention testing an electrically conductive contact in an electrical connector, comprising: (a) placing an electrical connector underneath an insertion tip and above a test probe; (b) coupling a contact to the insertion tip; (c) moving the test probe toward the electrical connector until an end of the test probe is at a starting position; (d) activating a first linear actuator to insert the contact further into a hole in the electrical connector by moving the contact in a first direction opposite to the second direction for a sufficient distance that an end of the contact would contact the end of the test probe at the starting position and then displace the test probe in the first direction away from the starting position provided that the insertion tip and test probe are in the same hole; (e) using a position sensor to detect whether the position of the end of the test probe at the end of step (d) is separated from the starting position by at least a first distance or not; and (f) if step (e) detects that the position of the end of the test probe at the end of step (d) is separated from the starting position by at least the first distance, activating a second actuator to move the test probe in the second direction and toward the starting position by applying a force that is less than a minimum contact retention force. At least steps (d) and (f) are performed under control by a computer.

Another aspect of the subject matter disclosed in detail below is a method for inserting and retention testing an electrically conductive contact in an electrical connector, comprising: manually partially inserting the contact into a hole formed inside the electrical connector; inserting the contact further into the hole by pushing the contact along an axis using an insertion tip that is aligned with the axis and that displaces in a first direction along the axis during inserting; and after inserting the contact further into the hole, testing retention of the contact inside the electrical connector by pushing the contact along the axis using a test probe that is aligned with the axis and that displaces in a second direction opposite to the first direction during testing. During inserting the contact further into the hole, the insertion tip is in contact with one end of the contact, and during retention testing the test probe is in contact with another end of the contact. The method further comprises displacing the test probe along the axis in the second direction before inserting the contact further into the hole, the displacement of the test probe in the second direction before inserting the contact further into the hole being driven by applying a force manually.

In accordance with various embodiments, the method described in the preceding paragraph further comprises one or more of the following steps: generating an electrical signal if the test probe does not displace along the axis in the first direction by at least a specified distance during inserting the contact further into the hole; causing the insertion tip to vibrate if the test probe does not displace along the axis in the first direction by at least a specified distance during inserting the contact further into the hole; and applying a force on the test probe that urges the test probe to displace along the axis in the second direction after inserting the contact further into the hole, wherein the force applied is less than a specified contact retention force.

A further aspect of the subject matter disclosed in detail below is an apparatus for inserting and retention testing an electrically conductive contact in an electrical connector, comprising: a connector holder configured to hold an electrical connector; an insertion tip configured to contact one end of a contact partially inserted in a hole in the electrical connector while providing clearance for a wire that is terminated by the contact; an insertion tip displacement assembly configured to displace the insertion tip in a first direction along a first linear path to further insert the insertion tip in the hole in the electrical connector; a test probe configured to contact another end of the contact after the contact has been inserted further into the hole; and a test probe displacement assembly configured to displace the test probe in a second direction along a second linear path, wherein the second direction is opposite to the first direction, and the first and second linear paths partially overlap. The apparatus further comprises: a controller configured to cause the insertion tip displacement assembly to displace the insertion tip along the first linear path in the first direction during a first portion of a time cycle and later cause the test probe displacement assembly to displace the test probe along the second linear path in the second direction during a second portion of the time cycle; and a position sensor that senses a position of the test probe and outputs signals representing the position of the test probe to the controller.

In accordance with one embodiment of the system described in the preceding paragraph, the controller is further configured to generate an error signal if the test probe does not displace along the second linear path in the first direction by at least a specified distance during displacement of the insertion tip along the first linear path in the first direction. In accordance with the same embodiment or a different embodiment, the apparatus further comprising a vibrator mounted to the insertion tip displacement assembly, in which case the controller is further configured to activate the vibrator if the test probe does not displace along the second linear path in the first direction by at least a specified distance during displacement of the insertion tip along the first linear path in the first direction. In accordance with the same embodiment or a different embodiment, the test probe displacement assembly is configured to urge the test probe to displace along the second linear path in the second direction by applying a force that is less than a specified contact retention force, and the controller is further configured to generate an error signal if the test probe displaces along the second linear path in the second direction by more than a specified distance in response to application of the force by the test probe displacement assembly.

In accordance with some embodiments, the insertion tip displacement assembly comprises: an insertion cylinder that causes the insertion tip to displace along the first linear path in the first direction in response to activation of the insertion cylinder; and a first return cylinder that causes the insertion tip to displace along the first linear path in the second direction in response to activation of the first return cylinder. In addition, the test probe displacement assembly comprises a test cylinder that causes the test probe to displace along the second linear path in the second direction in response to activation of the test cylinder and a second return cylinder that causes the test probe to displace along the second linear path in the first direction in response to activation of the second return cylinder.

In accordance with one proposed implementation, the test probe displacement assembly further comprises: a rotatable shaft; a manually operable activation lever fixedly mounted to one end of the shaft; a pinion gear fixedly mounted to the shaft and comprising a multiplicity of teeth; a test probe support shelf to which the test probe is fixedly mounted; and a rack affixed to the test probe support shelf and comprising a multiplicity of teeth, at least one tooth on the rack being interengaged with a pair of teeth on the pinion gear, wherein the test cylinder and the test probe support shelf are arranged so that the test probe support shelf is contacted by and displaced in a direction parallel to the second direction by one end of a piston rod of the test cylinder when the test cylinder is activated, but is not attached to the one end of the piston rod of the test cylinder. In one implementation, the test probe displacement assembly further comprises a return block fixedly mounted to the shaft and disposed in a path of one end of a piston rod of the second return cylinder after the test probe support shelf has been displaced by the one end of the piston rod of the test cylinder. The test probe is displaceable along the second linear path in the second direction by manual rotation of the activation lever while the test cylinder is inactive.

Yet another aspect of the subject matter disclosed in detail below is a method for inserting an electrically conductive contact in a hole in an electrical connector, comprising: (a) placing an electrical connector underneath an insertion tip and above a test probe; (b) coupling a contact to the insertion tip; (c) moving the test probe toward the electrical connector until an end of the test probe is at a starting position; (d) moving the insertion tip to insert the contact further into the hole in the electrical connector; (e) using a position sensor to detect whether the position of the end of the test probe at the end of step (c) is separated from the starting position by at least a specified distance or not; and (f) if step (e) detects that the position of the end of the test probe at the end of step (d) is not separated from the starting position by at least the specified, displaying symbology on a human-machine interface (or emitting/generating an audible or other perceptible signal) indicating that the contact and the test probe are not in the same hole.

Other aspects of apparatus and methods for inserting and retention testing an electrically conductive contact in an electrical connector are disclosed below.

BRIEF DESCRIPTION OF THE DRAWINGS

The features, functions and advantages discussed in the preceding section may be achieved independently in various embodiments or may be combined in yet other embodiments. Various embodiments will be hereinafter described with reference to drawings for the purpose of illustrating the above-described and other aspects. None of the diagrams briefly described in this section are drawn to scale.

Reference will hereinafter be made to the drawings in which similar elements in different drawings bear the same reference numerals.

DETAILED DESCRIPTION

Figure 1:
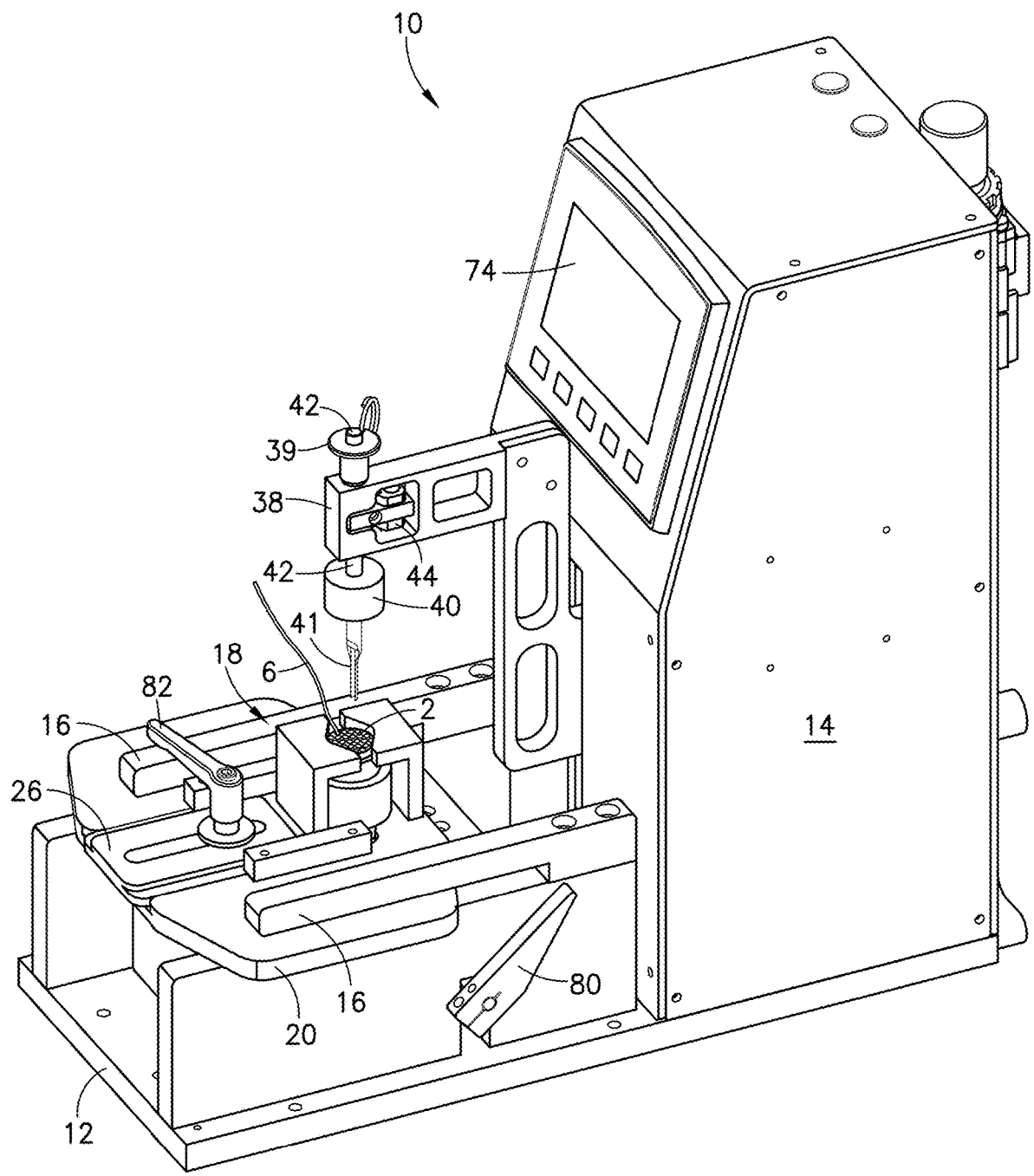
FIG. 1 is a diagram representing a view of an apparatus for automated insertion and testing of electrical contacts. An electrical connector is clamped in a position underneath a contact insertion tip.

Illustrative embodiments of apparatus and methods for inserting and retention testing an electrically conductive contact in an electrical connector are described in some detail below. However, not all features of an actual implementation are described in this specification. A person skilled in the art will appreciate that in the development of any such actual embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The apparatus and method disclosed in some detail below provides a technical solution to the technical problem of contacts which are not properly seated in electrical connectors during contact insertion. In accordance with one embodiment, the position of a test probe is monitored during a contact insertion operation to detect instances wherein the inserted contact is not being retained with sufficient retention force to be considered as locked in place inside the electrical connector. The machine inserts one contact (which contact is already crimped on one end of a wire) downward into one hole of a multiplicity of holes inside the electrical connector during a downward stroke of an insertion arm that holds an insertion tip configured to push on one end of the contact. Prior to this automated contact insertion step, a test probe is moved to a vertical position calculated to intercept the downward-moving contact near the bottom face of the electrical connector located with its centerline axis parallel to the axis of the insertion tip. (The axis of the test probe is coaxial with the axis of the insertion tip.) If the contact is inserted in the correct hole, then the downward-moving contact will impinge on the test probe (which either covers or is partially inserted in the correct hole) and force the test probe downward. That downward movement of the test probe is detected by a position sensor to confirm that the contact was inserted in the correct hole.

In an alternative scenario, it is possible that the contact will have been only partially inserted into the correct hole so that the contact is improperly seated and not retained with sufficient contact retention force. In other words, the contact in service may be pulled out of the hole or vibrations may cause the contact to move gradually out of the hole. If the contact is only partially inserted in the correct hole, then the downward-moving contact will impinge on the test probe (which either covers or is partially inserted in the correct hole) and force the test probe downward, but to an extent that is less than full insertion. That shortened downward movement of the test probe during automated contact insertion is again detected by the position sensor, which sends sensor data to a controller that causes the controller to activate a vibrator which is coupled to the insertion tip by way of a metal rod. The vibrator generates vibrations which propagate down the metal rod and cause the insertion tip to vibrate. If the partially inserted contact is hung up on a hard edge inside the electrical connector, the vibrations may induce the contact to move downward past the hard edge and further into the hole to a fully inserted position.

If the position sensor detects that the end of the test probe has moved downward to a vertical position below the lower bound of the "activate vibration" elevation range (indicating that the contact has been fully inserted), then the controller initiates an automated contact retention test, again involving the test probe. During conventional manual contact retention testing, the test technician tests the retention force being exerted on the contact by the electrical connector by manually either pulling on the wire or pushing on the contact using a tool. The automated contact retention test method disclosed herein replicates the latter, i.e., pushing on the contact.

In accordance with one embodiment of the testing apparatus, the testing method involves applying a force on the test probe that urges the test probe to displace in an upward direction along a linear path that is collinear with the axis of the insertion tip, i.e., in a direction opposite to the direction of movement of the insertion tip during an insertion stroke.

It should be noted at this juncture that, although the apparatus embodiments disclosed herein are arranged so the insertion tip and the test probe both travel along a line that is generally vertical, the methodology disclosed herein can be adapted to an apparatus in which the insertion tip and the test probe both travel along a line that is generally horizontal or any angle between vertical and horizontal. In accordance with one proposed implementation, the retention test force is applied pneumatically. The force applied pneumatically is less than a specified contact retention force. Since at the start of the retention test, the test probe abuts the distal end of the contact at the time when a piston rod of a pneumatic cylinder is extended, urging the test probe to move upward, the contact and test probe will move upward in tandem unless the retention force is sufficient to hold the contact in place despite the applied force. The controller generates an electrical signal if the position sensor indicates that the test probe has displaced upward by more than a specified distance in response to the applied force. In response to the electrical signal, an error indicator or message may be displayed on a human-machine interface, alerting the operator to the fact that the contact insertion has failed. In other embodiments, the error indicator is "sounds", "beeps", or a control message send to another machine that is connected to it.

FIG. 1 is a diagram representing a view of an apparatus 10 for automated insertion and testing of electrical contacts. An electrical connector 2 is seen clamped in a position underneath an insertion tip 41. The apparatus 10 includes the following components: a base 12; a housing 14 attached to the base 12; a pair of lift-restricting arms 16 attached at one end in the manner of a cantilever beam to the base 12; and a connector holder assembly 18 which holds the electrical connector 2. The connector holder assembly 18 is restrained from moving vertically upward by the lift-restricting arms 16, but is able to slide horizontally during contact insertion, which allows a contact-receiving hole in the electrical connector 2 to move into final alignment with the contact being inserted. The connector holder assembly 18 (which will be described in more detail later with reference to FIGS. 6 and 16) includes: a main plate 20 that fits in a pair of slots underneath the lift-restricting arms 16 and is slidable in any direction for aligning a particular hole in the connector 2 with the insertion tip 41 (including incremental adjustments to align the hole with the contact being inserted); a sliding plate 28 that slides linearly in a linear groove formed in the main plate 20 and to which the electrical connector 2 is clamped; and a locking handle 82 that locks the sliding plate 28 in place relative to the main plate 20.

Figure 6:
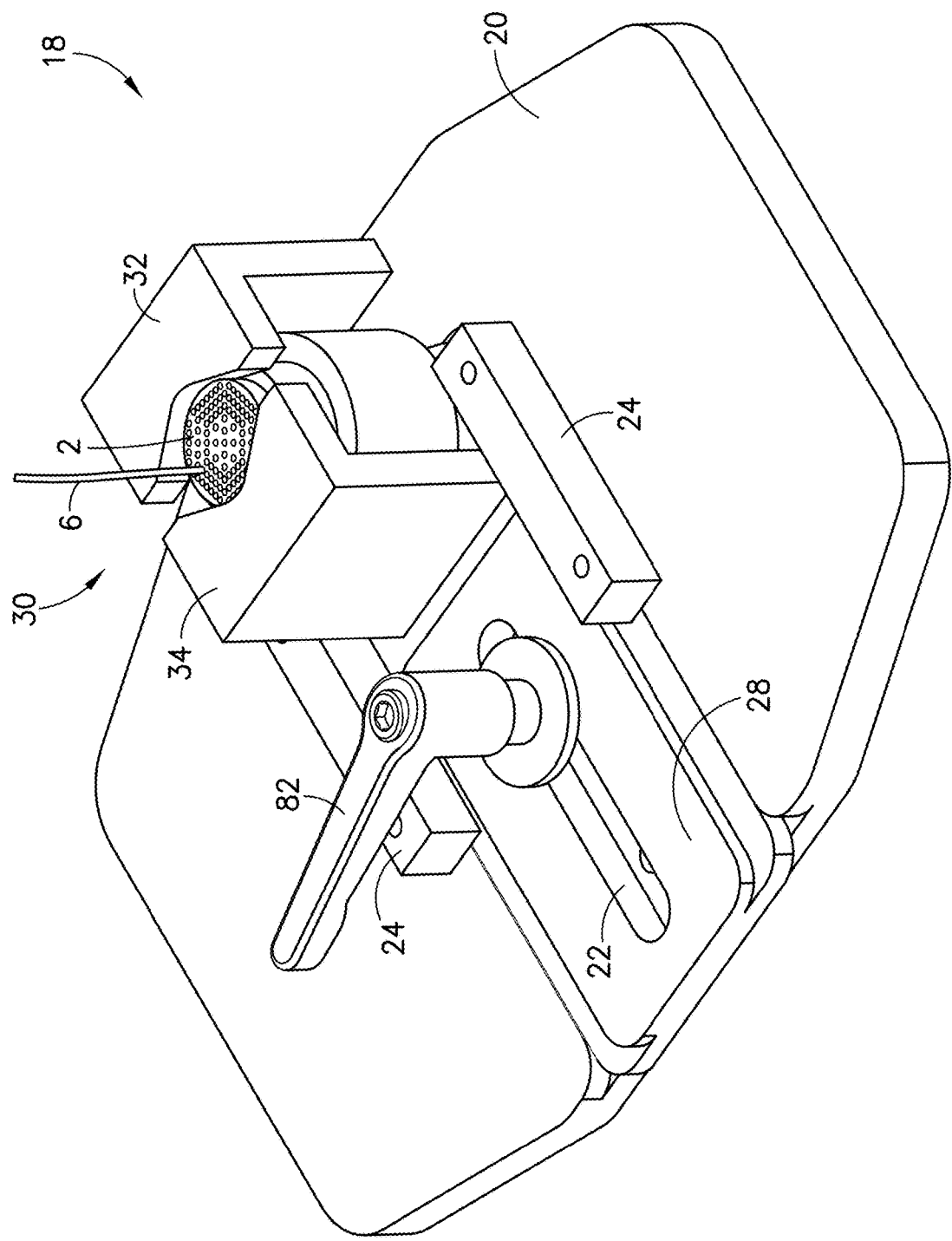
FIG. 6 is a diagram representing a view of the connector holder assembly included in the apparatus depicted in FIG. 1.

FIG. 6 is a diagram representing a view of the connector holder assembly 18. Sliding of the sliding plate 28 in the linear groove formed in main plate 20 is facilitated by a pair of slide arms 24 that are attached (e.g., fastened) to the main plate 20 and configured to partly overlie the linear groove along its parallel edges, thereby preventing the sliding plate 28 from being lifted upward and out of the groove. As seen in FIG. 6, the locking handle 82 is rotatably mounted to a bolt that passes through a linear slot 22 formed in the sliding plate 28 and is threadably coupled to the main plate 20. The linear slot 22 prevents interference with the bolt as the sliding plate 28 is slid in the linear groove. The connector holder assembly 18 further includes a clamp 30 consisting of a first jaw 32 which is fixedly coupled to the main plate 20 and a second jaw 34 which is fixedly coupled to the sliding plate 28. As seen in FIG. 6, the electrical connector 2 (with a wire 6 connected to a contact inserted in one hole) is clamped between the jaws 32 and 34. The position of the second jaw 34 is adjustable by moving the sliding plate 28 toward the electrical connector 2 until the second jaw 34 abuts the shell of the electrical connector 2. Then the sliding plate 28 is locked in place by turning the locking handle 82, thereby firmly clamping the shell of the electrical connector 2 and holding the shell in a fixed position relative to the main plate 20.

Referring again to FIG. 1, the apparatus 10 further includes the following components: an insertion tip 41 having an axis and a distal end configured to contact one end of a contact partially inserted in a hole in the electrical connector 2 while providing clearance for a wire that is terminated by the contact; and associated mechanisms (referred to herein as the "insertion tip displacement assembly") for displacing the insertion tip 41 along a first linear path (in this example, a vertical linear path) that is collinear with the axis of the insertion tip 41. The insertion tip displacement assembly includes an insertion arm 38 that is vertically displaceable relative to the housing 14 and projects through a vertical slot formed in the housing 14. The insertion tip displacement assembly further includes a quick release pin 42 that passes through a vertical bore in the end of the insertion arm 38 and a quick release button 39 that is attached to the insertion arm 38 and holds the quick release pin 42 in a fixed vertical position relative to the insertion arm 38. The insertion tip displacement assembly further includes an insertion tip holder 40 (e.g., in the form of a collar) that holds the insertion tip 41 so that the axis of the insertion tip 41 is parallel with a centerline of the shell of the electrical connector 2 during vertical displacement of the insertion arm 38. The components for driving vertical displacement of the insertion arm 38 (which components are described in more detail below) are disposed inside the housing 14 and not visible in FIG. 1. The apparatus 10 shown in FIG. 1 further includes a vibration module 44 that is vibrationally coupled to the quick release pin 42. The vibration module 44 is configured to generate vibrations in the quick release pin 42. When activated by the apparatus controller (not shown in FIG. 1), the vibration module 44 generates vibrations which propagate down the quick release pin 42 and cause the insertion tip 41 to vibrate. This assembly depicted in FIG. 1 provides a method to quickly attach and detach the insertion tip 41, provides the ability to apply vibratory forces to the insertion tip 41 to aid in insertion, and provides for the insertion tip 41 to be rotated slightly after being mounted to aid in manipulating the wire 6 into the insertion tip 41.

Figure 2:
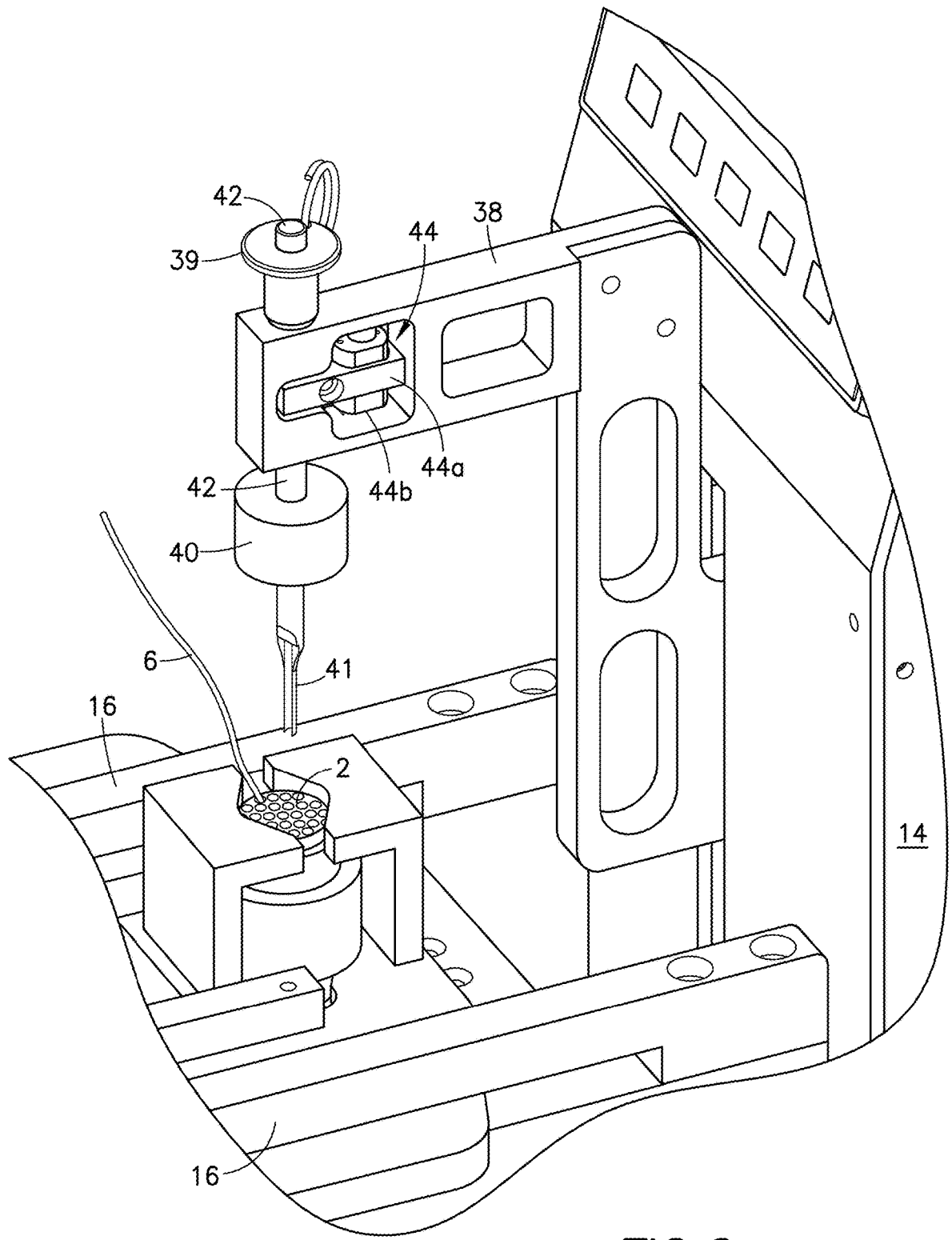
FIG. 2 is a diagram representing a view of the apparatus depicted in FIG. 1, with the difference that a contact at the end of a wire has been manually partially inserted into a hole in the clamped electrical connector.

FIG. 2 is a diagram representing a view of the apparatus 10 depicted in FIG. 1, with the difference that an electrical contact at the end of a wire 6 has been manually partially inserted into a hole in the clamped electrical connector 2. The vibration module 44 includes a clamp 44a that clamps onto the quick release pin 42 and a vibration motor 44b mounted to the clamp 44a. The insertion tip 41 is fixedly coupled to the end of the quick release pin 42 by the insertion tip holder 40.

Electrical connectors come in many sizes and configurations. This disclosure is concerned with multi-hole electrical connectors which accept a multiplicity of contacts which respectively terminate a multiplicity of wires making up a wire bundle. Electrical connector assemblies generally include a plug and a receptacle, each of which contains a dielectric insert that has electrical contacts retained within bores in the inserts. The rear portion of the assembly contains a sealing grommet, through which the wires connected to the contacts pass, and which grommet seals the contacts contained in the insert from moisture. The sealing grommet is usable in various electrical connector assemblies wherein contacts are retained within dielectric inserts with the wires leading to said contacts passing through a grommet that seals the connectors from moisture. One-half of a connector assembly for use with pin-type (i.e., male) contacts has a contact retaining insert formed of dielectric material, a plurality of pin-type contacts secured within axial holes of the insert, an interfacial seal, a front retaining ring, a connector shell, a retaining nut and a rear retaining nut, with the sealing grommet provided to prevent access to the contacts by moisture from the environment. The dielectric insert has a face which contacts the sealing grommet and an opposite face which faces the interfacial seal for the front of the pin-type contacts. Wires lead from the contacts through the sealing grommet. The sealing grommet is typically formed of a rubber-type material, such as a silicone rubber or neoprene rubber, has a front face and a rear face, with a plurality of axial passageways therethrough which cooperate and align with the axial holes of the dielectric insert. Each contact occupies a single axial passageway formed in the sealing grommet.

Figure 17:
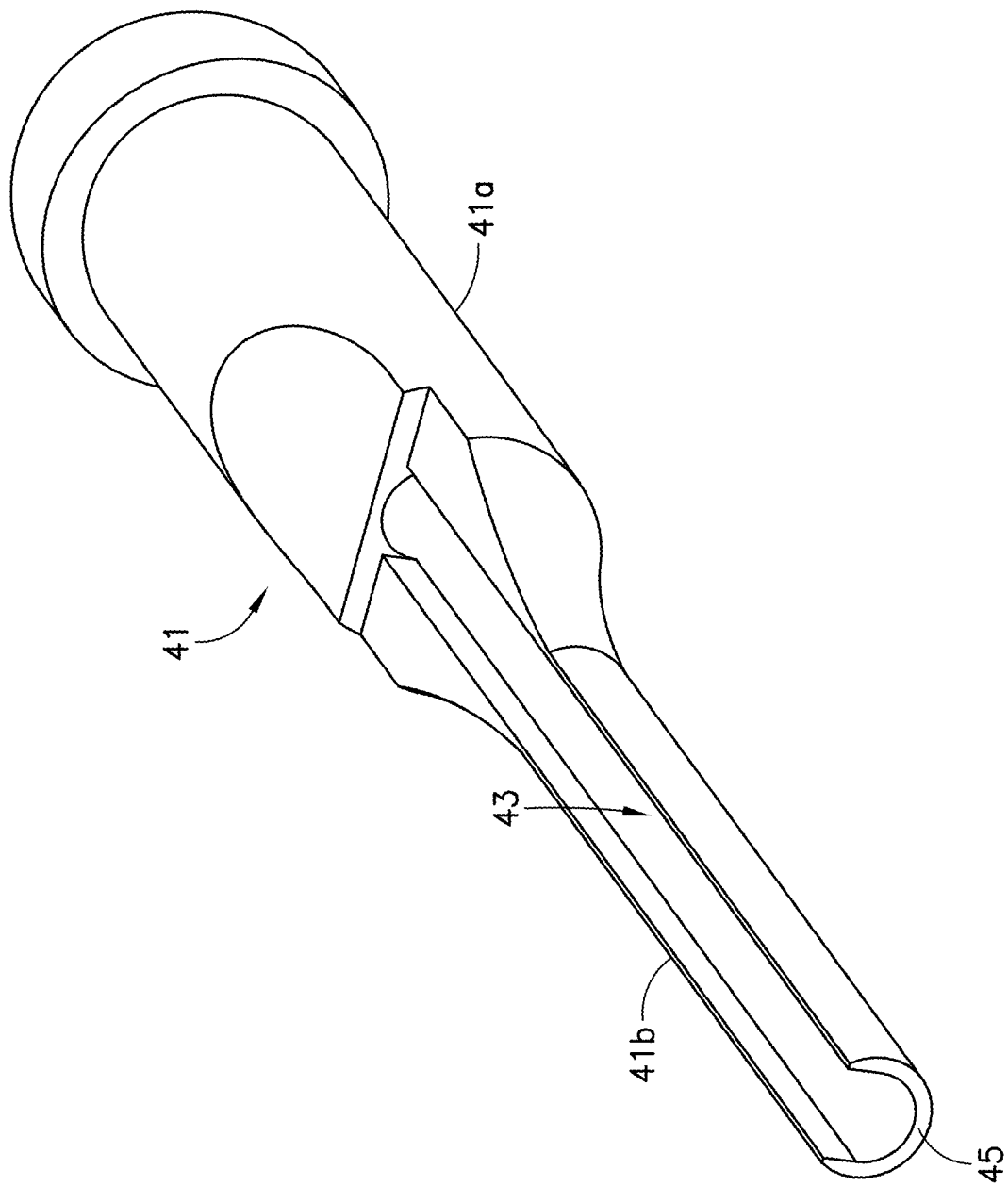
FIG. 17 is a diagram representing a three-dimensional view of a typical insertion tip.

FIG. 17 is a diagram representing a three-dimensional view of a typical insertion tip 41. The insertion tip 41 has a circular cylindrical portion 41a that is held by the insertion tip holder 40 (not shown in FIG. 17, but see FIG. 2). The insertion tip 41 also has a grooved portion 41b having a C-shaped cross section. The radius of the grooved portion 41b is selected to fit inside the holes of the electrical connector 2 (not shown in FIG. 17, but see FIG. 2). The grooved portion 41b of the insertion tip 41 has a C-shaped or semi-circular end face 45 which abuts a portion of the electrical contact during insertion into the electrical connector 2.

Figure 18:
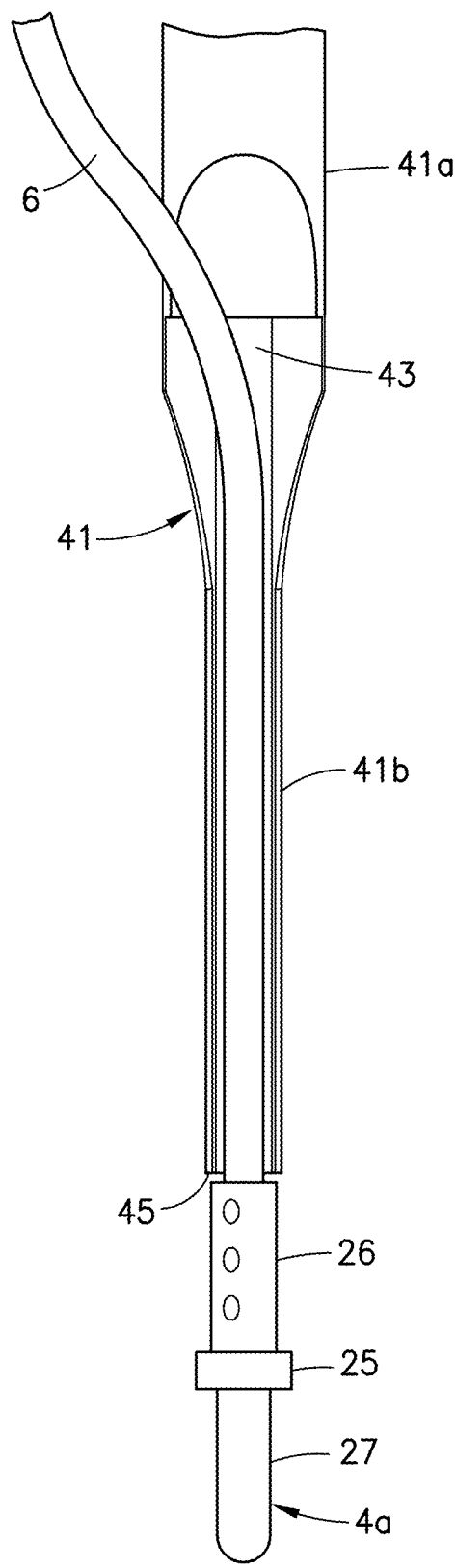
FIG. 18 is a diagram representing a side view of a portion of a wire pressed into a groove formed in the insertion tip depicted in FIG. 17, with the contact on the end of the wire in abutment with an end face of the insertion tip.

FIG. 18 is a diagram representing a side view of a portion of a wire 6 pressed into the groove 43 formed in the insertion tip 41 depicted in FIG. 17. An unjacketed end portion of the wire 6 has a pin-type contact 4a (made of metal) crimped thereon. The pin-type contact 4a includes a contact pin 27, a locking tab or shoulder 25 (which will be retained by a retainer mechanism inside a hole in the electrical connector 2), and a crimp barrel 26 having indentations where the crimp barrel 26 has been crimped onto the unjacketed end portion of the wire 6. In the example depicted in FIG. 18, during downward motion of the insertion tip 41, the end face 45 abuts the confronting end face of the crimp barrel 26 and pushes the pin-type contact 4a into a hole in the electrical connector 2. In other situations, the end face 45 of the insertion tip 41 is configured to engage the locking tab or shoulder 25 of the pin-type contact 4a

Figure 19:
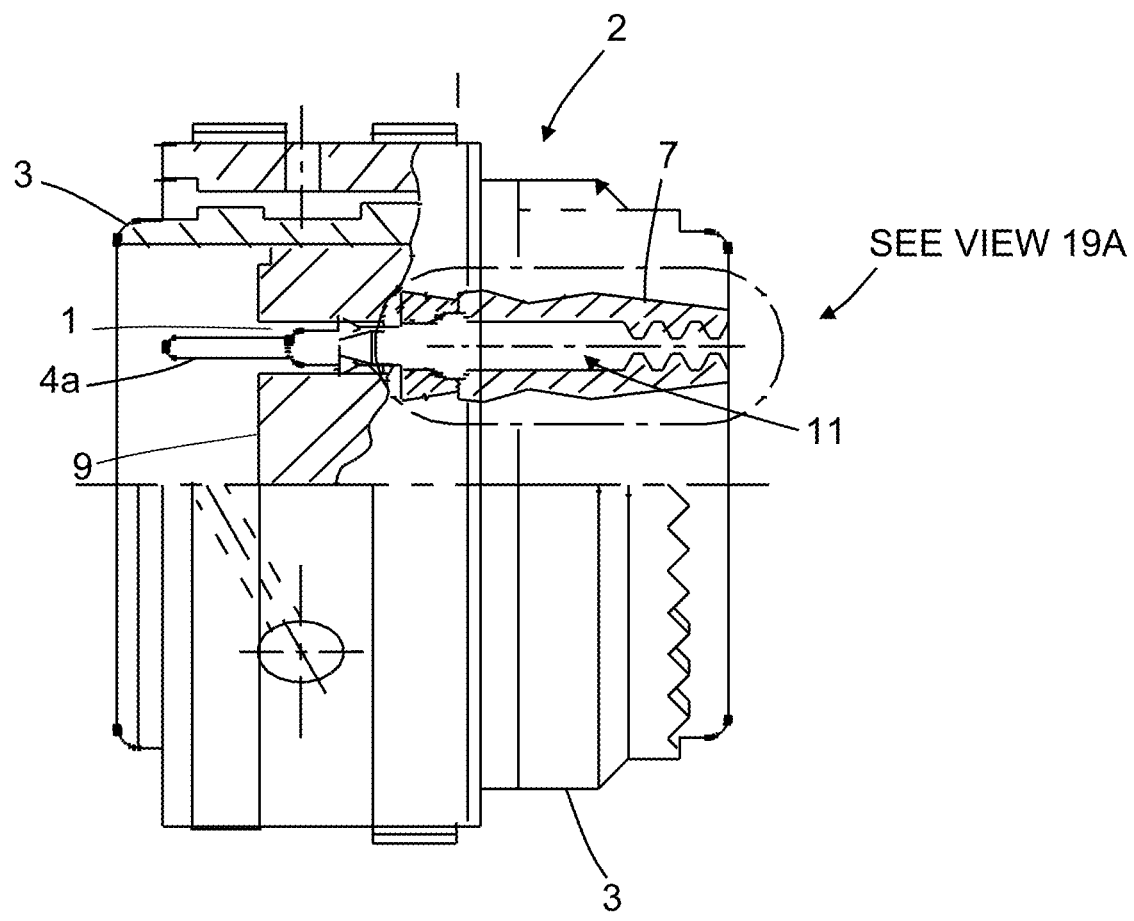
FIG. 19 is a diagram representing a cross-sectional view of a pin contact inserted in an electrical connector.

FIG. 19 is a diagram representing a cross-sectional view of a typical pin-type contact 4a inserted in a hole formed in a rigid front insulator 8 and in an axial passageway 11 formed in a sealing grommet 7 of an electrical connector 2. The sealing grommet 7 and rigid front insulator 9 are both seated inside a shell 3 of the electrical connector 2. As seen in FIG. 19, the pin-type contact 4a protrudes out of the hole 1 in the rigid front insulator 8 when the pin-type contact 4a is in its final position. In some implementations, the pin contacts 4a is held in place by resilient fingers (not shown in FIG. 19 that latch behind the locking tab or shoulder 25 of the pin-type contact 4a.

Figure 19A:
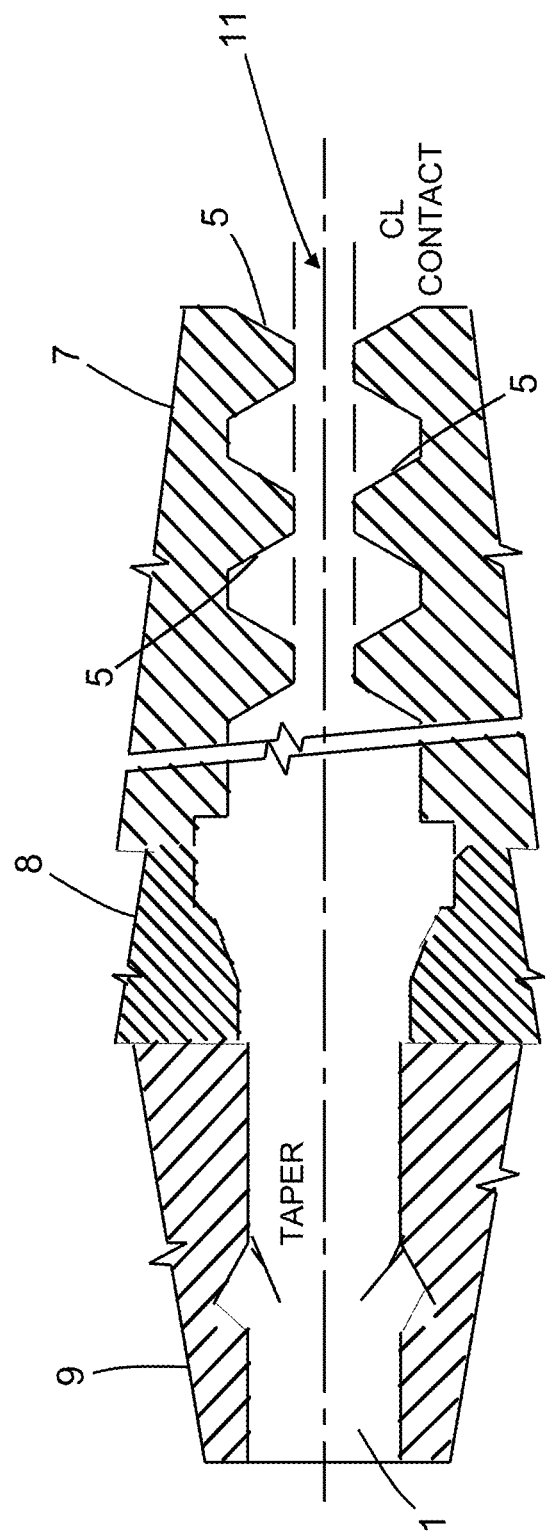
FIG. 19A is a diagram representing a magnified view of the portion of the assembly inside the circle labeled 19A in FIG. 19.

FIG. 19A is a diagram representing a magnified view of the portion of the assembly inside the oval labeled 19A in FIG. 19. The assembly includes a sealing grommet 7 and a rigid front insulator 9 with a resilient front insulator 8 sandwiched therebetween. The axial passageway 11 in the sealing grommet 7 is aligned with the hole 1 in the front insulators. The internal surface of each axial passageway 11 has resilient convolutions 5 which enable the use of the sealing grommet 7 with a range of wire gauges, so that the sealing grommet 7 is usable in various connector assemblies without the need for a special grommet for each different wire gauge, while assuring an efficient moisture seal for the contacts.

Figure 20:
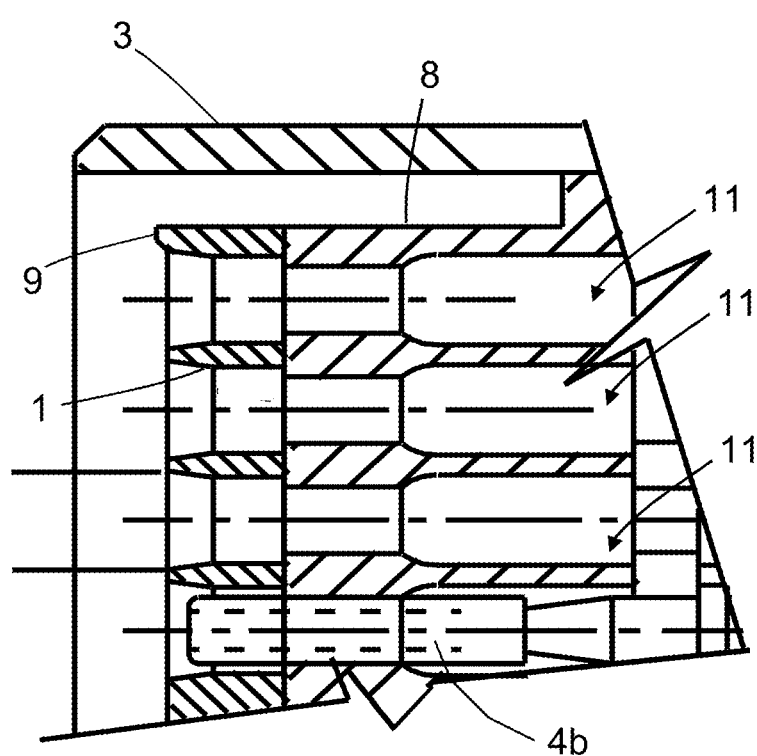
FIG. 20 is a diagram representing a cross-sectional view of a socket contact inserted in an electrical connector.

FIG. 20 is a diagram representing a cross-sectional view of a socket-type contact 4b inserted in an electrical connector 2. In some implementations, the electrical connector for receiving socket-type contacts 4b has components similar to the components seen in FIG. 19. However, as seen in FIG. 20, the socket-type contacts 4b do not protrude outside the holes 1 formed in the rigid front insulator 9.

Figure 3:
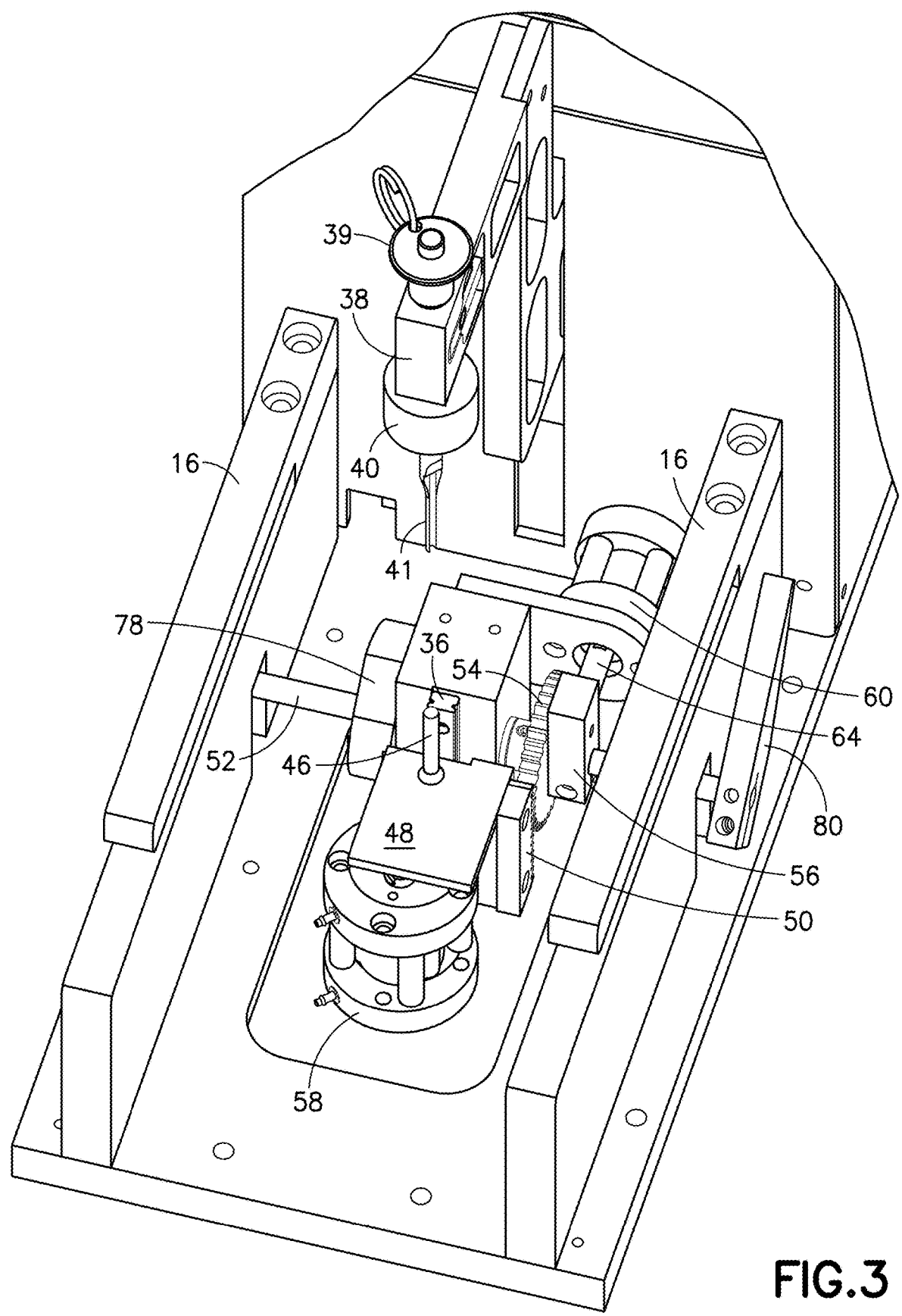
FIG. 3 is a diagram representing a view of portions of the apparatus depicted in FIG. 1 following removal of the connector holder assembly to reveal a test probe (separated from the insertion tip above by a large gap) and associated mechanisms for raising and lowering the test probe.

FIG. 3 is a diagram representing a view of portions of the apparatus 10 depicted in FIG. 1 following removal of the connector holder assembly 18 to reveal a test probe 46 (separated from the insertion tip 41 above by a large gap) and associated mechanisms (referred to herein as the "test probe displacement assembly") for vertically displacing the test probe 46 along a second linear path that is collinear with the axis of the insertion tip 41 and aligned with the first linear path. The movements of the test probe 46 and insertion tip 41 are coordinated by a controller 76 which is programmable (see FIG. 13). The distal end of the insertion tip 41 leads the insertion tip 41 when the insertion tip 41 is displaced in a first direction (e.g., downward), and the distal end of the test probe 46 leads the test probe 46 when the test probe 46 is displaced in a second direction (e.g., upward) opposite to the first direction. The test probe 46 has an axis and a distal end configured to contact another end of the contact 4a or 4b after the contact 4a or 4b has been inserted further into a hole in the electrical connector 2 by the insertion tip 41.

Figure 4:
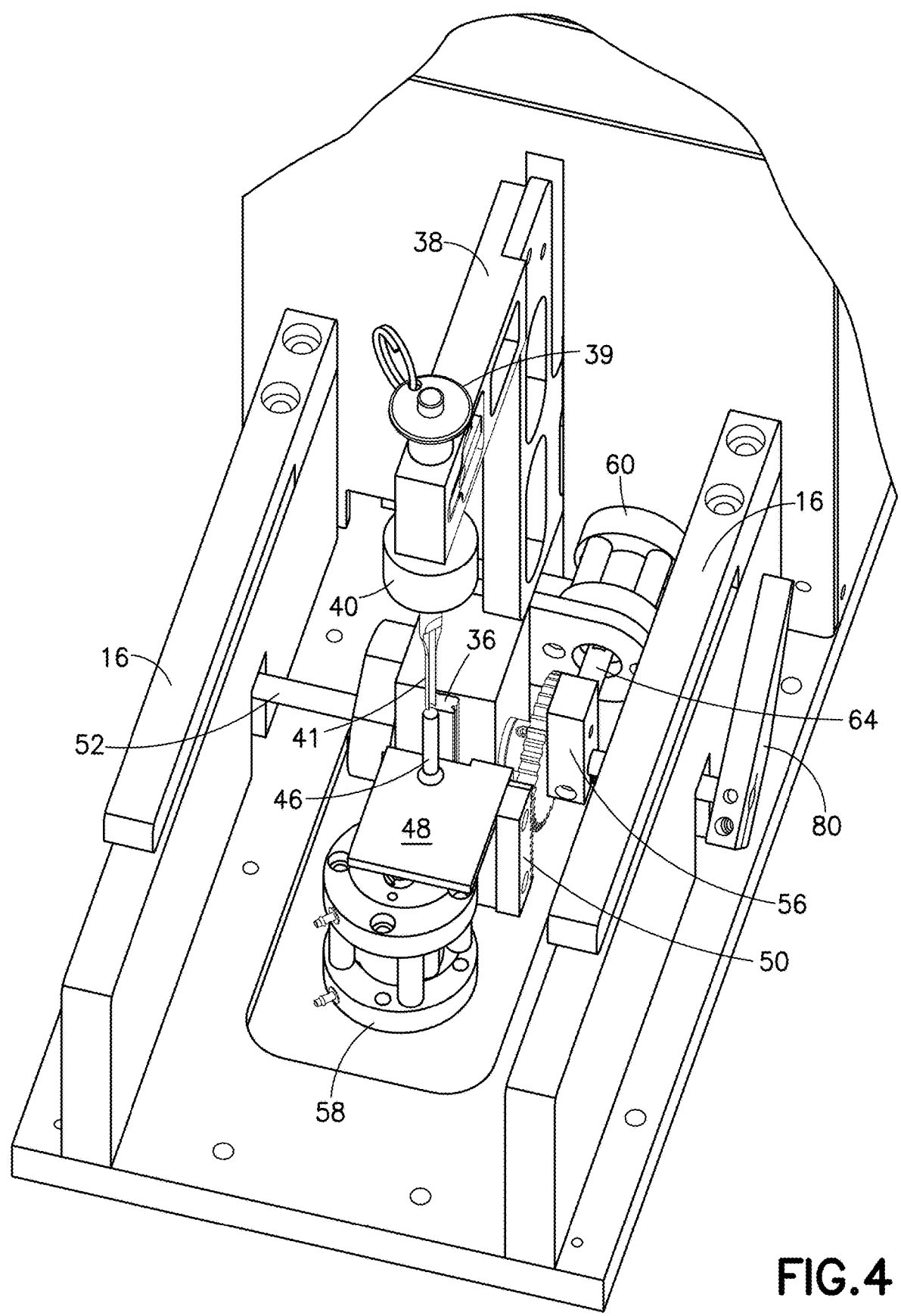
FIG. 4 is a diagram representing a view of portions of the apparatus depicted in FIG. 1 following removal of the connector holder assembly to reveal the test probe (separated from the insertion tip above by a small gap) and associated mechanisms for raising and lowering the test probe following an upward displacement of the test probe.

The test probe displacement assembly includes the following components: a rotatable shaft 52; a pair of manually operable activation levers 80 fixedly mounted to opposing ends of the shaft 52; a pinion gear 54 fixedly mounted to the shaft 52 and comprising a multiplicity of teeth; a test probe support shelf 48 which is movable vertically along a linear bearing 36 and to which the test probe 46 is fixedly mounted; a rack 50 affixed to the test probe support shelf 48 and comprising a multiplicity of teeth, at least one tooth on the rack 50 being interengaged with a pair of teeth on the pinion gear 54; and a return block 56 fixedly mounted to the shaft 52. The rack 50 and pinion gear 54 convert rotation of shaft 52 into linear displacement of the test probe support shelf 48. The shaft 52 is rotated during manual rotation of the activation levers 80. Thus the test probe 46 is displaceable along the second linear path in the second direction by manual rotation of the activation levers 80. As described below, the test probe 46 is also vertically displaceable up and down by a pair of pneumatic cylinders, which cause the shaft 52 to rotate. FIG. 4 is a diagram representing a view of portions of the apparatus depicted in FIG. 3 after the test probe 46 has been displaced upward. FIG. 4 shows the test probe 46 separated from the insertion tip 41 above by a small gap; in contrast to FIG. 3, which shows the test probe 46 in a lower position with a larger gap separating the test probe 46 and the insertion tip 41.

Figure 8:
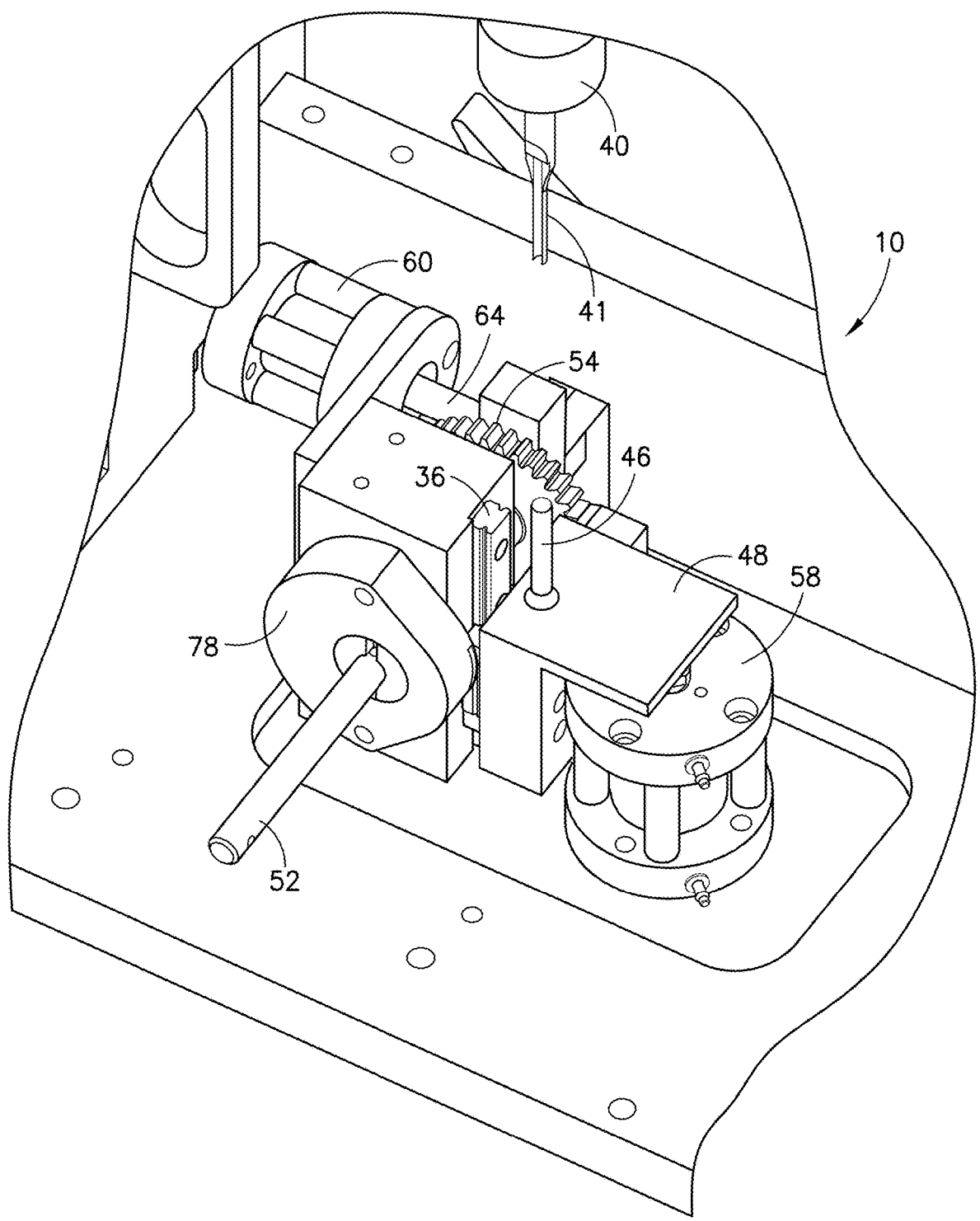
FIG. 8 is a diagram representing another view of portions of the apparatus depicted in FIG. 1 following removal of the connector holder assembly to reveal the test probe (separated from the insertion tip above by a large gap) and associated mechanisms for raising and lowering the test probe.

As best seen in FIG. 8, the apparatus 10 further includes an angular position sensor 78 (e.g., a rotary potentiometer) which is configured and mounted to detect the angular position of the shaft 52. Since the vertical displacement of the test probe 46 is directly proportional to the degree of rotation of the shaft 52, the angular position sensor 78 outputs electrical signals that represent the vertical position of the test probe 46 relative to the frame of reference of the base 12. The angular position sensor 78 senses the position of the test probe 46 and outputs signals representing the position of the test probe to a controller 76 (see FIG. 13) for processing the sensor data.

Figure 5:
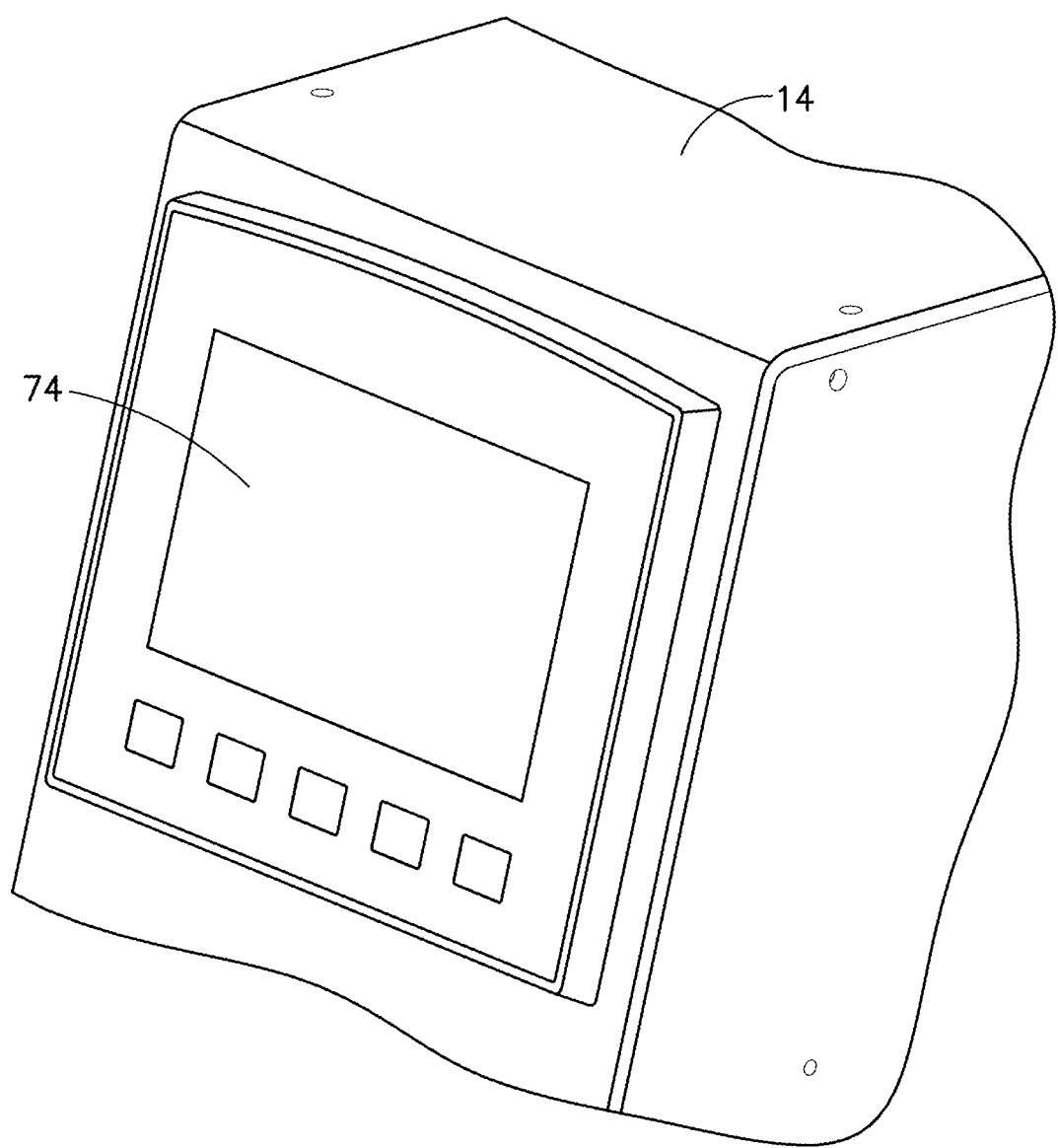
FIG. 5 is a diagram representing a view of a human-machine interface of the apparatus depicted in FIG. 1.

The controller 76 is configured to cause the insertion tip displacement assembly to displace the insertion tip 41 along the first linear path in the first direction during a first portion of a time cycle and later cause the test probe displacement assembly to displace the test probe 46 along the second linear path in the second direction during a second portion of the time cycle. The apparatus is also configured to output display control signals to a human-machine interface 74 indicating error states or successful retention based on shaft angular position data received from the angular position sensor 78. In response to receipt of such display control signals from the controller 76, the human-machine interface 74 displays symbology indicating error states or successful retention to the operator. FIG. 5 is a diagram representing a view of the human-machine interface 74 of the apparatus 10 depicted in FIG. 1. This implementation of the human-machine interface 74 is a touch-screen liquid-crystal display device.

Figure 13:
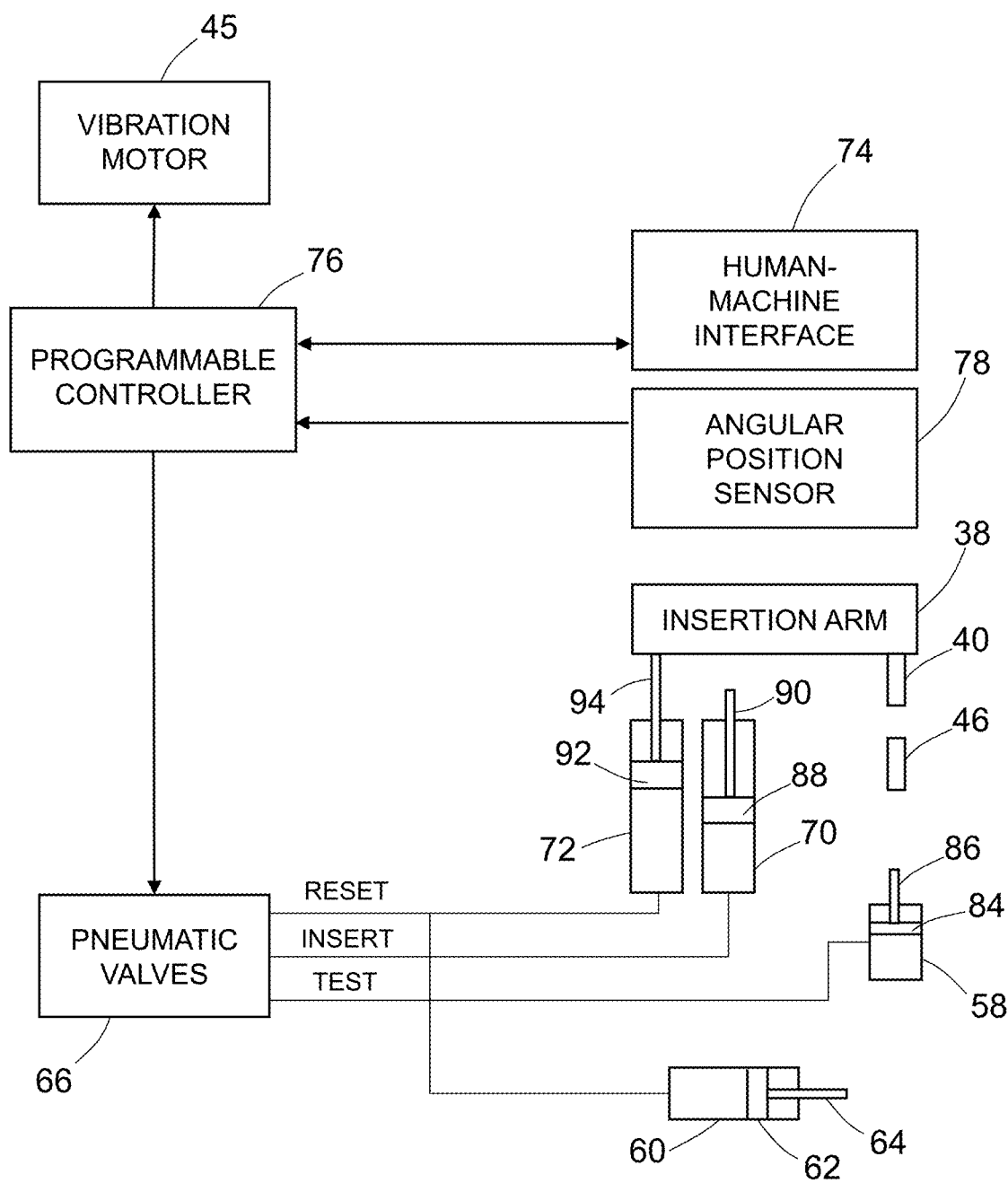
FIG. 13 is a block diagram identifying some components of the apparatus depicted in FIG. 1.

In accordance with one proposed implementation depicted in FIG. 13, both the insertion tip displacement assembly and the test probe displacement assembly include pneumatic cylinders 58, 60, 70 and 72 for driving the respective displacements in either direction. The pneumatic cylinders are connected to electrically controlled pneumatic valves 66 (e.g., solenoid valves) which are selectively activated by the controller 76, which sends electrical valve control signals to control the states of the pneumatic valves 66. When any one pneumatic valve is opened, compressed air from a main air supply is provided to the associated pneumatic cylinder, causing the piston rod of that pneumatic cylinder to be extended.

Still referring to FIG. 13, the insertion tip displacement assembly includes the following additional components: an insertion cylinder 70 (having a piston 88 connected to a piston rod 90) that causes the insertion arm 38 to displace in the first direction with the insertion tip 41 displacing along the first linear path (in the first direction) in response to activation of the insertion cylinder 70 and a first return cylinder 72 (having a piston 92 connected to a piston rod 94) that causes the insertion arm 38 to displace in the second direction with the insertion tip 41 displacing along the first linear path (in the second direction) in response to activation of the first return cylinder 72. Similarly, the test probe displacement assembly includes the following additional components: a test cylinder 58 (having a piston 84 connected to a piston rod 86) that causes the test probe support shelf 48 to displace in the second direction with the test probe 46 displacing along the second linear path (in the second direction) in response to activation of the test cylinder 58 and a second return cylinder 60 (having a piston 62 connected to a piston rod 64) that causes the test probe support shelf 48 to displace in the first direction with the test probe 46 displacing along the second linear path (in the first direction) in response to activation of the second return cylinder 60. Thus the up and down movements of the insertion tip 41 are decoupled, as are the up and down movements of the test probe 46. Furthermore, it should be noted that the test cylinder 58 and the test probe support shelf 48 are arranged so that the test probe support shelf 48 is contacted by and displaced in a direction parallel to the second direction by one end of the piston rod 86 of the test cylinder 58 when the test cylinder 58 is activated, but is not attached to the one end of the piston rod 86 of the test cylinder 58. This upward vertical displacement of the test probe support shelf 48 in turn raises the test probe 46, which is affixed to the test probe support shelf 48. In addition, the return block 56 (seen in FIGS. 3, 4 and 8), which is fixedly mounted to the shaft 52, is disposed in the path of the one end of the piston rod 64 of the second return cylinder 60 after the test probe support shelf 48 has been displaced upward by the one end of the piston rod 86 of the test cylinder 58.

Figure 7:
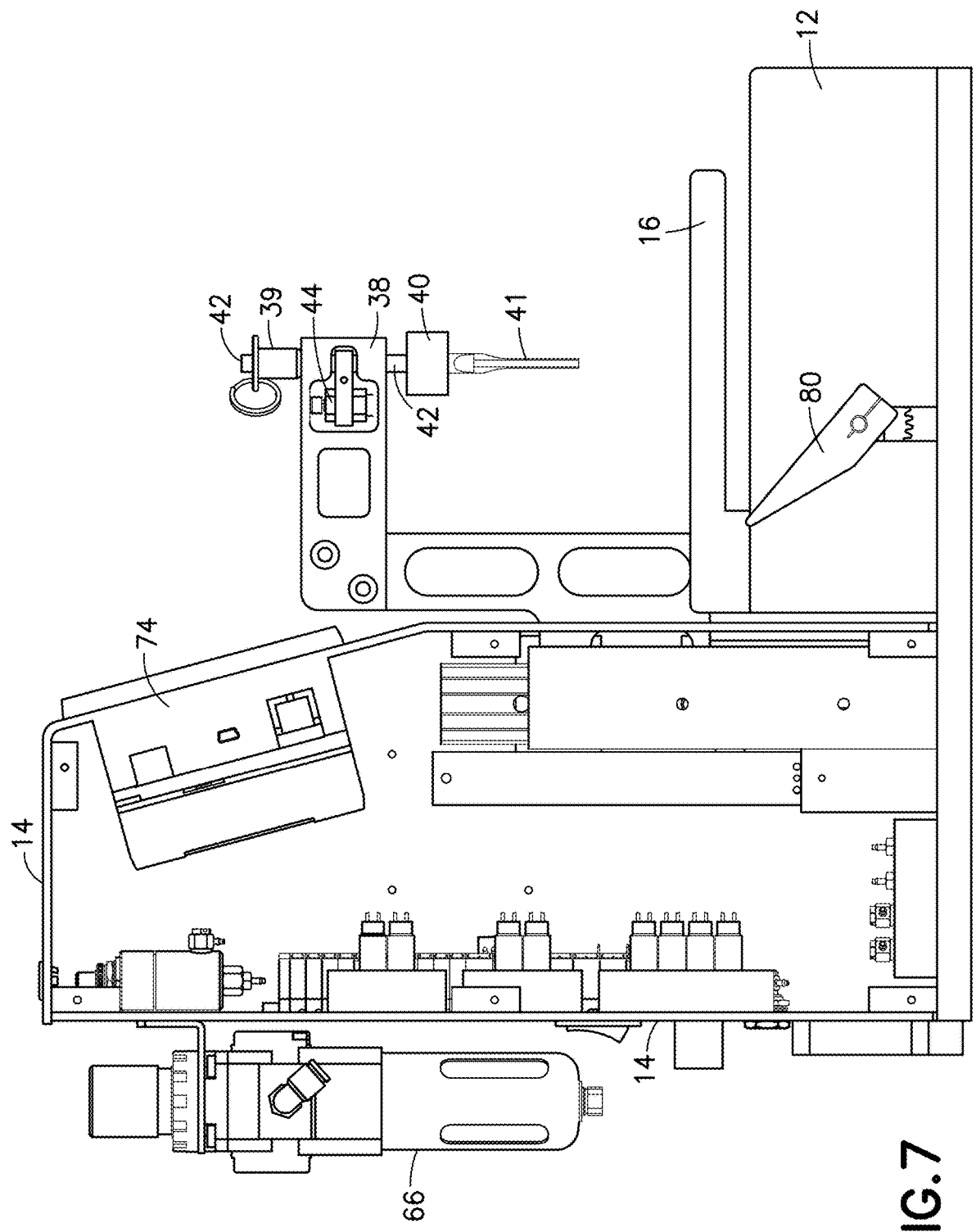
FIG. 7 is a diagram representing a side view of the apparatus depicted in FIG. 1 with the left-side cover open and the connector holder assembly removed.

FIG. 7 is a diagram representing a side view of the apparatus depicted in FIG. 1 with the left-side cover open to reveal the pressure regulators and gauges inside the housing 14. Each pneumatic cylinder is operatively coupled to a pressure regulator 66 by way of a respective pneumatic valve and a respective flexible hose (not shown in the drawings). The pressure regulator 66 regulates (i.e., reduces) the pressure of the compressed air being supplied via tubing from a main air supply (not shown in the drawings).

The controller 76 also controls activation of the vibration module 44 (see FIGS. 1 and 7). The controller 76 activates the vibration module 44 in response to data from the angular position sensor 78 indicating that the contact being inserted was not fully inserted. More specifically, the controller 76 is configured to activate the vibration module 44 if the test probe 46 does not displace along the second linear path in the first direction by at least a specified distance during displacement of the insertion tip 41 along the first linear path in the first direction. For example, this occurs if the contact was inserted in the correct hole but did not reach a position whereat the contact could be retained by the retention mechanism (e.g., spring fingers or a retention clip) inside the hole.

In other cases, the contact 4a or 4b is inserted in the wrong hole while the test probe 46 is inserted in the correct hole. In this case, the test probe 46 will not move in the first direction when the insertion tip 41 is moved in the first direction because the contact being pushed downward by the insertion tip 41 does not impinge upon the test probe 46, which is in a neighboring hole. The controller 76 is further configured to generate an error signal if the test probe 46 does not displace along the second linear path in the first direction by at least a specified distance during displacement of the insertion tip 41 along the first linear path in the first direction.

As previously mentioned, the controller 76 is configured to cause the test probe displacement assembly to displace the test probe 46 along the second linear path in the second direction during a second portion of the time cycle for the purpose of testing the retention of an inserted contact. During the retention test, the test probe displacement assembly (namely, the test cylinder 58) urges the test probe 46 to displace along the second linear path in the second direction by applying a force that is less than a specified contact retention force. The controller 76 is further configured to generate an error signal if the test probe 46 displaces along the second linear path in the second direction by more than a specified distance in response to application of force by the test cylinder 58. Upward displacement by more than the specified distance indicates that the pin- or socket-type contact (which is abutting the distal end of the test probe 46) is not being retained inside the hole 1 in the electrical connector 2.

Figure 21B:
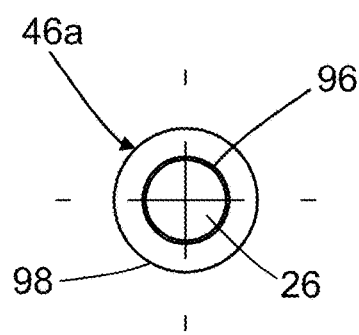
Figure 22A:
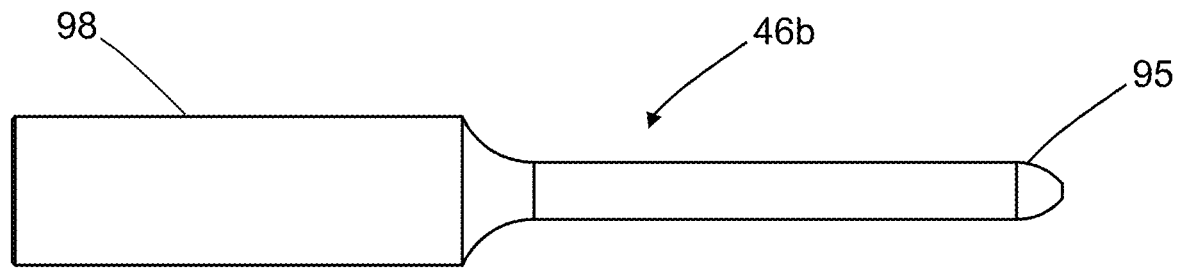
FIGS. 22A and 22B are diagrams representing side and end views respectively of a pin-type test probe in accordance with one embodiment.
Figure 22B:
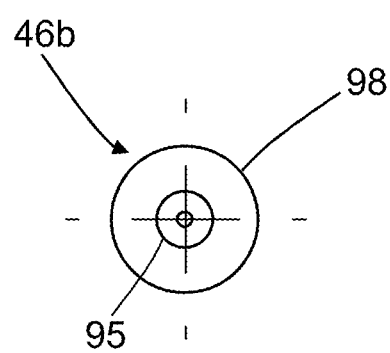

FIGS. 22A and 22B are diagrams representing side and end views respectively of a pin-type test probe 46a (for use in inserting a pin-type contact 4a of the type depicted in FIG. 19) in accordance with one embodiment. The pin-type test probe 46a has a shank 98 and a distal end 96 with a flat end face 23 that is designed to abut and push against the end of the pin-type contact 4a. As seen in FIG. 21B, the distal end 96 of pin-type test probe 46a has a diameter less than the diameter of the shank 98.

Figure 21A:
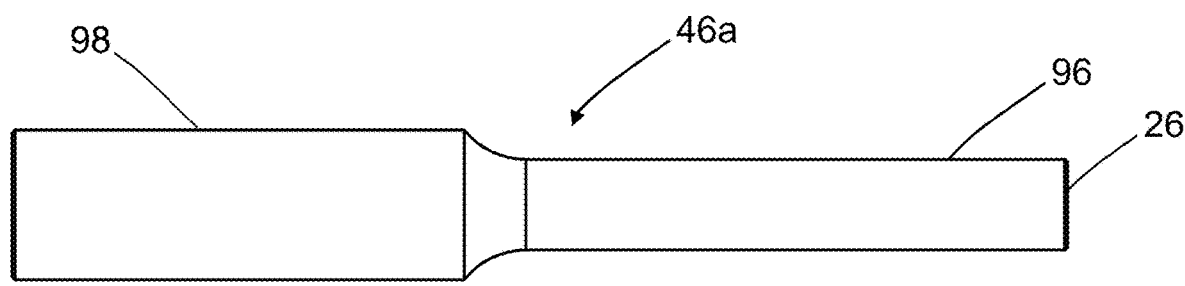
FIGS. 21A and 21B are diagrams representing side and end views respectively of a socket-type test probe in accordance with one embodiment.

FIGS. 21A and 21B are diagrams representing side and end views respectively of a socket-type test probe 46b (for use in inserting a socket-type contact 4b of the type depicted in FIG. 20) in accordance with one embodiment. The socket-type test probe 46b has a shank 98 and a round distal end 95 with a flat end face that is designed to be partially inserted into and push against the end of the socket-type contact 4a. Thus the flat end face is circular with a diameter less than the diameter of the opening in the socket-type contact 4a.

Figure 9:
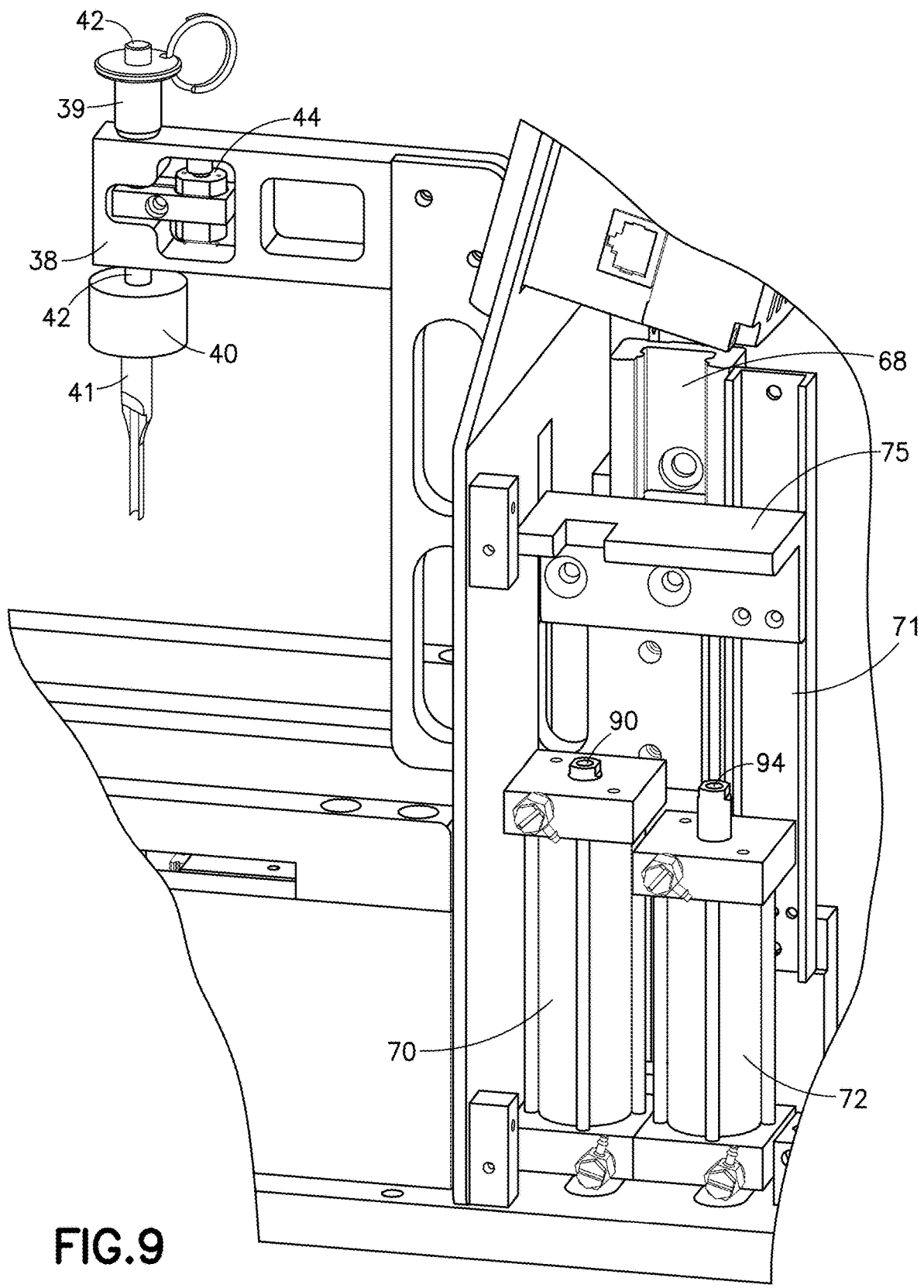
FIG. 9 is a diagram representing a side view of portions of the apparatus depicted in FIG. 1 with the right-side cover open and the connector holder assembly removed.

FIG. 9 is a diagram representing a side view of portions of the apparatus 10 depicted in FIG. 1 with the right-side cover open and the connector holder assembly 18 removed. This view shows a linear guide rail 68 disposed inside the housing. More specifically, the linear guide rail 68 is disposed vertically and guides vertical displacement of an insertion arm displacement plate 75 to which the insertion arm 38 is affixed. The apparatus further includes linear bearings that enable the insertion arm displacement plate 75 to travel smoothly along the guide rail 68 in response to activation of the one of the insertion cylinder 70 and first return cylinder 72.

The smaller channel to the right of the linear guide rail 68 in FIG. 9 is a linear displacement transducer 71 that directly measures the vertical position (elevation) of the insert arm 38. More specifically, the linear displacement transducer 71 senses a position of a component (e.g., insertion arm displacement plate 75) of the insertion tip displacement assembly that has a fixed positional relationship relative to the insertion tip 41 and outputs signals representing the position of the insertion tip 41 to the controller 76.

In accordance with one implementation, the linear displacement transducer 71 is used to unlock a "hold up" function of the insert arm 38 which happens at the end of a complete cycle. The insert arm 38 is raised at the end of a cycle and held there until it is manually lifted above a threshold position. This tells the controller 76 to cause the first return cylinder 72 to lower the piston rod 94. This gives the operator the ability to freely load contacts and manipulate the electrical connector 2 without the insert tip 41 getting in the way.

The linear displacement transducer 71 is useful for other purposes. For example, by noting the position of the insertion arm 38 as the tool inserts the contact in relation to insert time, in one proposed implementation the controller 76 is configured to determine if the contact is sticking and use that information to trigger warnings and also turn on the vibratory system. Another potential use case is to create "insertion graphs" of movement versus time which is displayed on the screen of the human-machine interface 74 and used as both a troubleshooting and a feedback mechanism for illustrating problem insertion cycles. In addition, the position information provided by the linear displacement transducer 71 enables calculation of the movement speed for the purposes of calibrating the machine for consistent operation and helping to detect maintenance issues.

Figure 10:
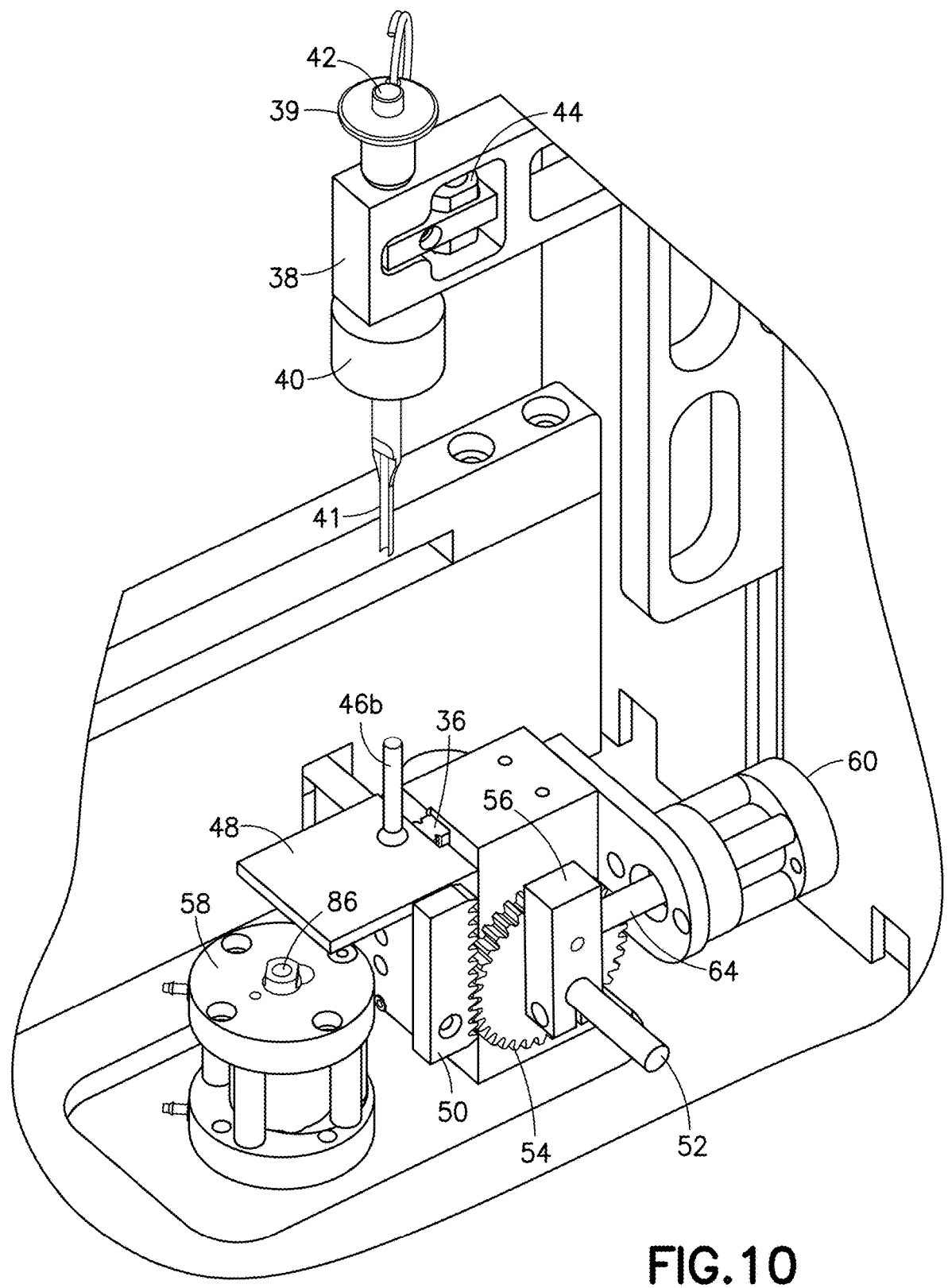
FIG. 10 is a diagram representing a view of portions of an apparatus in a state wherein an insertion tip and a test probe are separated by a large gap.

FIG. 10 is a diagram representing a view of portions of the apparatus 10 for automated insertion and testing of electrical contacts in a state wherein an insertion tip 41 and a test probe 46 are separated by a large gap. In this example, the test probe is a socket-type test probe 46b. FIG. 10 provides a more advantageous view of the components of the test probe displacement assembly which cause the test probe support shelf 48 to displace downward in response to activation of the second return cylinder 60. When the second return cylinder 60 is activated, the piston rod 64 is extended. As the piston rod 64 extends, the end of the piston rod 64 pushes against the return block 56, thereby causing the shaft 52 to rotate. Likewise the pinion gear 54, which is fixedly mounted to the shaft 52, rotates, thereby causing the rack 50 to displace vertically downward. This downward motion of the rack 50—which is attached to the test probe support shelf 48—lowers the socket-type test probe 46*b*

Figure 11:
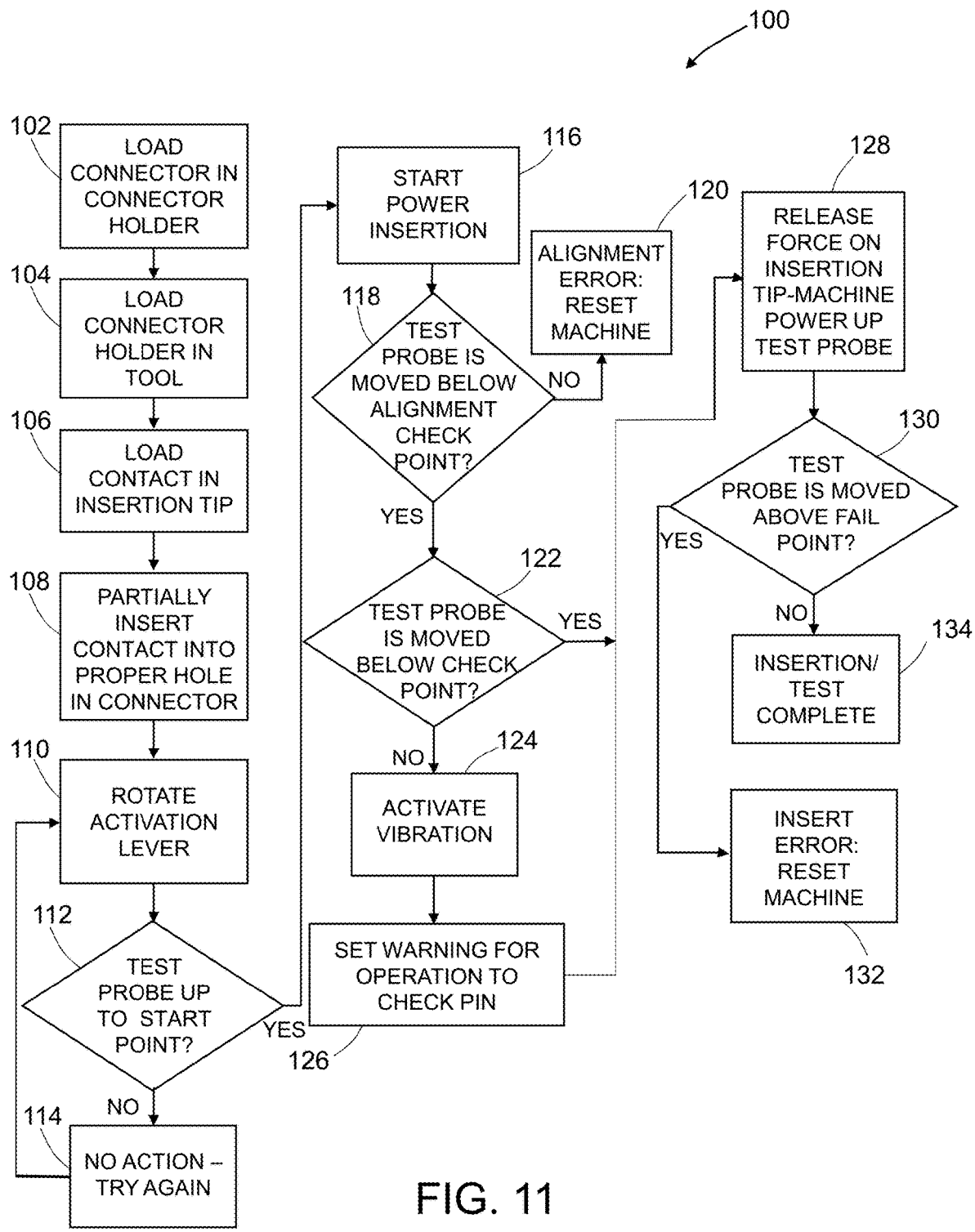
FIG. 11 is a flowchart identifying steps of a method for inserting a contact in an electrical connector and then testing for contact retention.

FIG. 11 is a flowchart identifying steps of a method 100 for inserting a contact in an electrical connector and then testing for contact retention. The angular position sensor 78 monitors the position of the test probe 46 at any time during the contact insertion and retention testing operations. The controller 76 receives feedback from the angular position sensor 78 during these operations and then applies logic to the sensor data to trigger certain actions. For example, the controller 76 determines if an error has occurred or, in the alternative, if insertion was successful in the sense that the inserted contact is being retained with a retention force greater than the testing force being exerted on the contact by the test probe 46.

Referring to FIG. 11, the method 100 includes the following steps. The electrical connector 2 is loaded in the connector holder assembly 18 (step 102). Then the connector holder assembly 18 is loaded into the slots underneath the lift-restricting arms 16 (step 104). The position of the main plate 20 is coarsely adjustable so that the electrical connector 2 is underneath the insertion tip 41. The contact is manually inserted in the insertion tip 106 by the operator (step 106). Then the insert arm 38 is lowered until the contact is partially inserted in a selected hole 1 in the electrical connector 2 (step 108). Again the position of the main plate 20 is finely adjustable so that the selected hole 1 in the electrical connector 2 is directly below the contact carried by the insertion tip 41. The operator then rotates the activation levers 80 (step 110), thereby moving the test probe 46 upward into the starting position. The mechanical components that make up the test probe mount and actuating mechanism provide adequate friction to hold the end face 23 of the test probe 46 at the starting position during tool activation. The primary sources of this friction are the angular position sensor 78 (e.g., rotary potentiometer), the solid bushings on opposing ends of the shaft 52, and the linear bearing 36 (shown in FIG. 3) which enables the test probe support shelf 48 to displace vertically.

Figure 12:
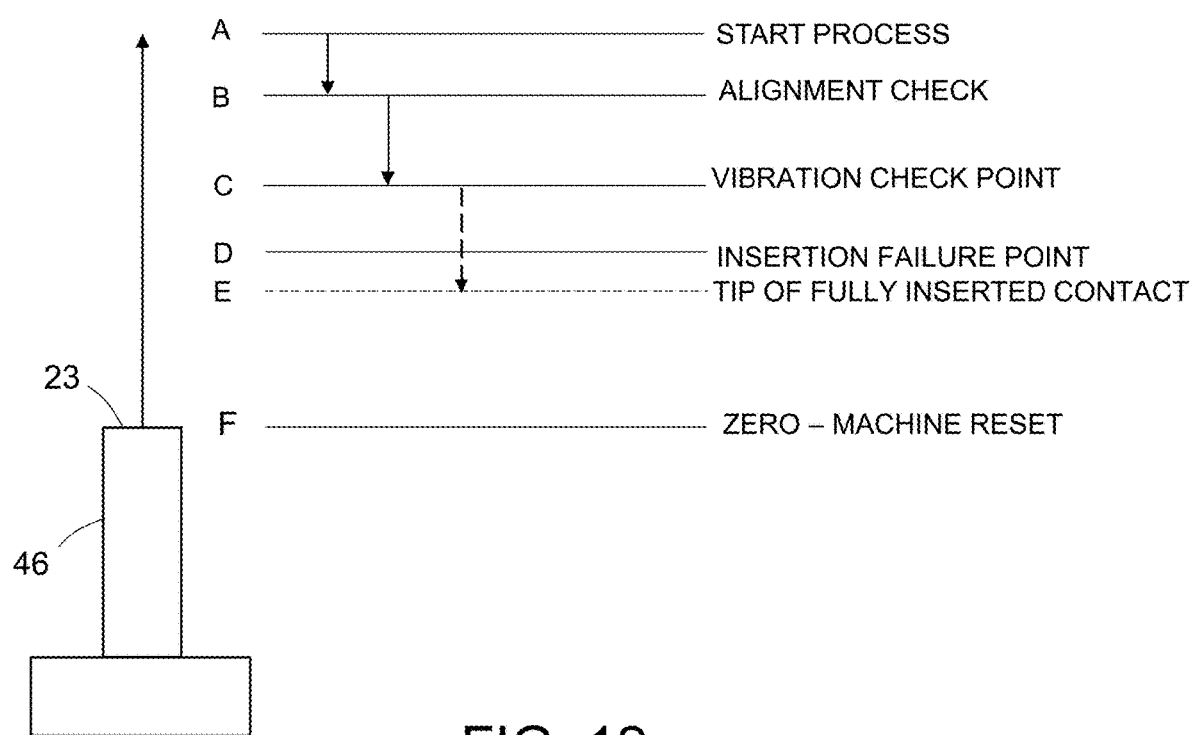
FIG. 12 is a diagram indicating various vertical positions of a test probe during one test cycle.

FIG. 12 is a diagram indicating various vertical positions A through F of the end face 23 of the test probe 46 during one test cycle. The lowermost horizontal line represents the zero position F of the end face 23 when the machine is reset (for example, by activation of the second return cylinder 60). The uppermost horizontal line represents the starting position A after the test probe 46 has been displaced vertically upward by the test cylinder 58. The next horizontal line represents a vertical position B corresponding to the alignment check point (explained in more detail below). The next horizontal line represents a vertical position C corresponding to the vibration check point (explained in more detail below). The next horizontal line represents a vertical position D corresponding to the insertion failure point (explained in more detail below). The dashed horizontal line represents a vertical position E corresponding to the position of the tip of the fully inserted contact and the position of the abutting end face 23 of the test probe 46.

Referring again to FIG. 11, subsequent to manual rotation of the activation levers 80, the controller 76 then determines whether the end face 23 of the test probe 46 is in the starting position A (see FIG. 12) based on the sensor feedback being received from the angular position sensor 78 or not (step 112). On the one hand, if the controller 76 determines in step 112 that the end face 23 of the test probe 46 is not in the starting position A, then the automated cycle is not initiated and an error message is displayed by the human-machine interface 74, indicating that the operator should troubleshoot the problem and then try again (step 114). On the other hand, if the controller 76 determines in step 112 that the end face 23 of the test probe 46 is in the starting position A, then the controller 76 activates the insertion cylinder 70, causing the insertion arm to move downward, thereby inserting the contact further into the selected hole 1 (step 116).

The controller 76 then determines whether the end face 23 of the test probe 46 has moved below the alignment check point at vertical position B (see FIG. 12) based on the sensor feedback being received from the angular position sensor 78 or not (step 118). On the one hand, if the controller 76 determines in step 118 that the end face 23 of the test probe 46 has not moved below the alignment check point, then the machine is reset by activating the first return cylinder 72 and an error message is displayed by the human-machine interface 74, indicating to the operator that the contact and the test probe 46 are not in the same hole (step 120).

On the other hand, if the controller 76 determines in step 118 that the end face 23 of the test probe 46 has moved below the alignment check point, then the controller 76 determines whether the end face 23 of the test probe 46 has moved below the vibration check point at vertical position C (see FIG. 12) based on the sensor feedback being received from the angular position sensor 78 or not (step 122). On the one hand, if the controller 76 determines in step 122 that the end face 23 of the test probe 46 has not moved below the vibration check point, then the vibration motor 44*b* is activated (step 124) and an error message is displayed by the human-machine interface 74, warning the operator to check the insertion pin (step 126) when the vibration cycle has ceased.

On the other hand, if the controller 76 determines in step 122 that the end face 23 of the test probe 46 has moved below the vibration check point, then the controller 76 deactivates the insertion cylinder 70 to release the downward force being exerted on the insertion tip 41 and then initiates the retention test by activating the test cylinder 58 to apply a force that pushes the test probe upward (steps 128), which applied force is less than the specified minimum retention force for the contact.

The controller 76 then determines whether the end face 23 of the test probe 46 has moved from below to above the insertion failure point at vertical position D (see FIG. 12) based on the sensor feedback being received from the angular position sensor 78 or not (step 130). On the one hand, if the controller 76 determines in step 130 that the end of the test probe 46 has moved above the insertion failure point, then the machine is reset by activating the first return cylinder 72 and an error message is displayed by the human-machine interface 74 (step 132), indicating to the operator that contact insertion has failed. On the other hand, if the controller 76 determines in step 130 that the end of the test probe 46 has not moved above the insertion failure point, then the controller 76 instructs the human-machine interface 74 to display a message indicating that contact insertion was successful, at which point the retention test cycle automatically ends.

Figure 14:
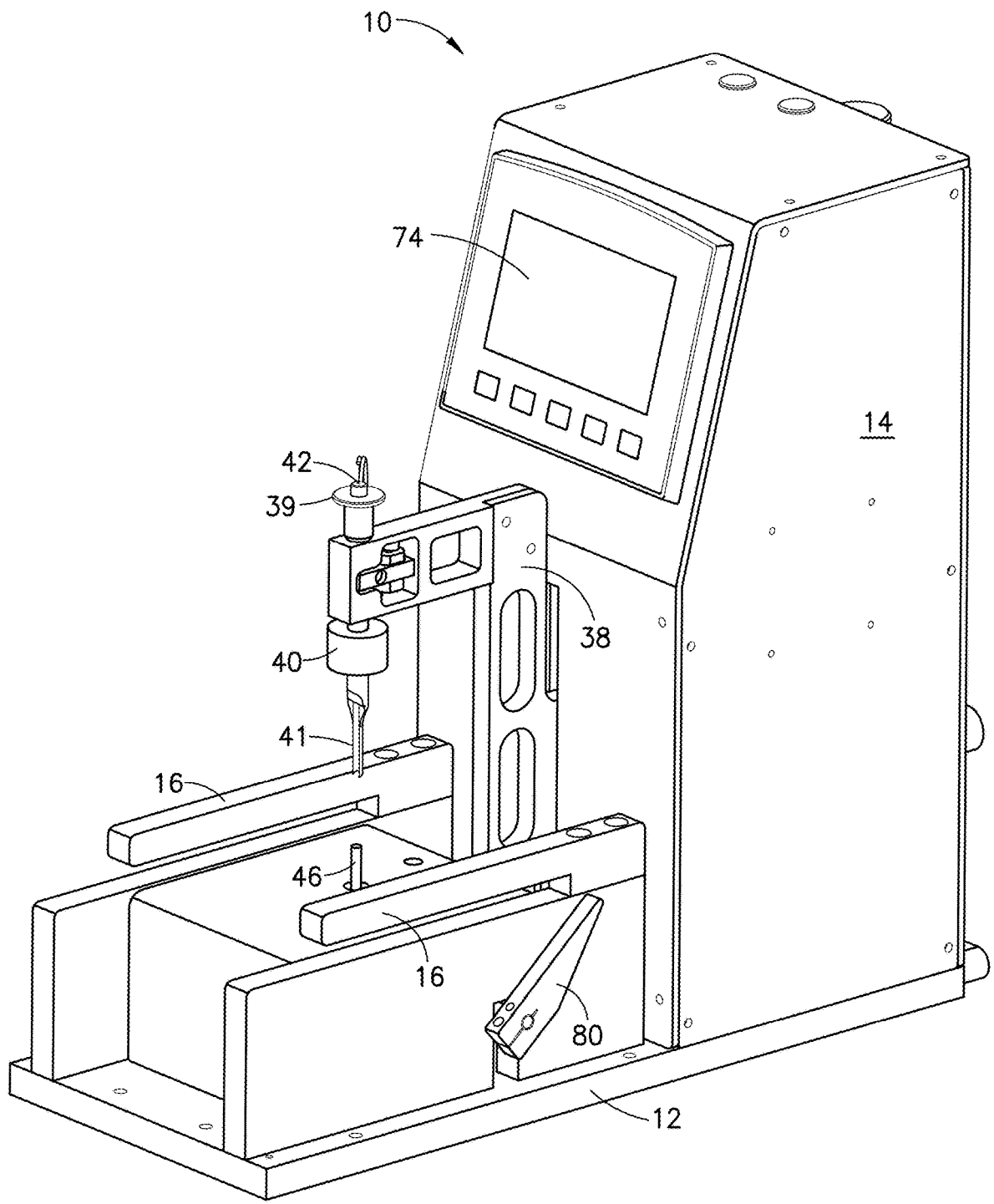
FIG. 14 is a diagram representing a view of some components of an apparatus for automated insertion and testing of electrical contacts in accordance with an alternative embodiment.
Figure 15:
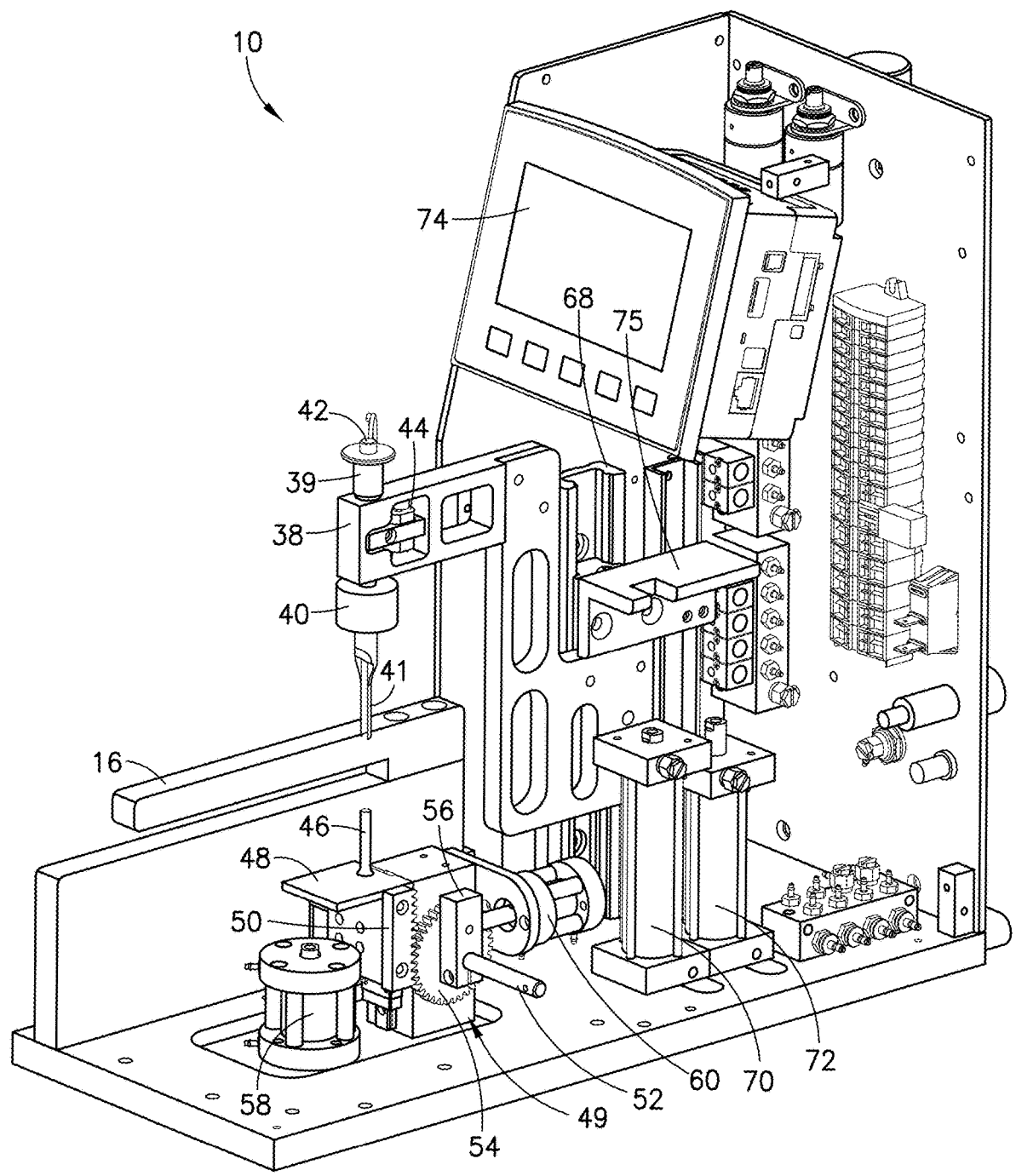
FIG. 15 is a diagram representing a cut-away view showing some internal components of the apparatus depicted in FIG. 14.

FIG. 14 is a diagram representing a view of the same components seen in FIG. 1, except that the connector holder assembly 18 has been removed. Elements in FIG. 14 which bear the same reference numerals as those appearing in FIG. 1 have the same functionality as the corresponding element in FIG. 1, which functionality has been described above and will not be repeated here. FIG. 15 is a diagram representing a cut-away view showing some internal components of the apparatus depicted in FIG. 14, including a test probe gear system 49 in the form of a rack 50 and a pinion gear 54.

Figure 16:
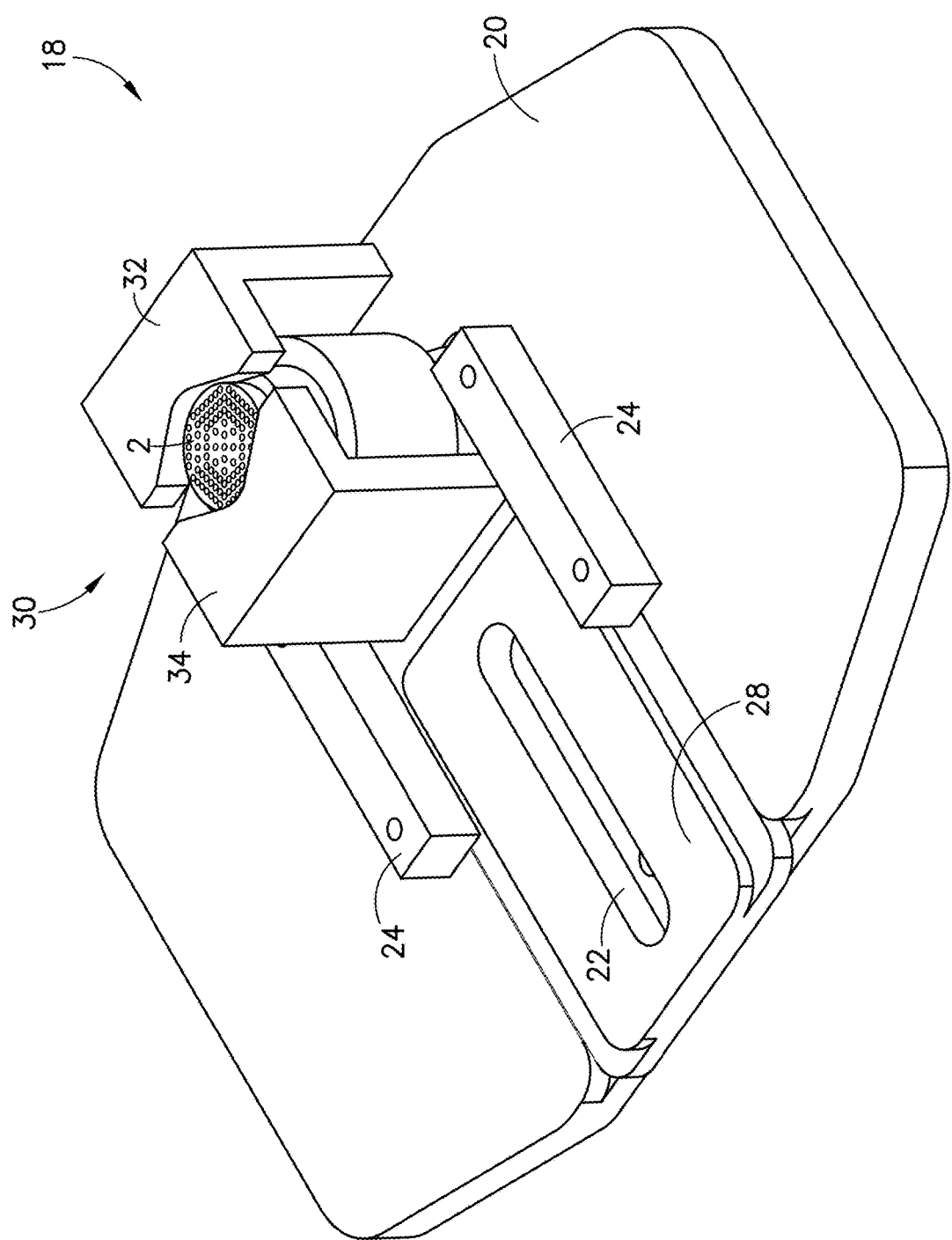
FIG. 16 is a diagram representing a view of a connector holder assembly suitable for use with the components of the apparatus depicted in FIG. 14.

FIG. 16 is a diagram representing an orthographic view of a connector holder assembly 18 in accordance with an alternative embodiment. The connector holder assembly 18 includes a clamp 30 consisting of a first jaw 32 which is fixedly coupled to the main plate 20 and a second jaw 34 which is fixedly coupled to the sliding plate 28. As seen in FIG. 16, the electrical connector 2 is clamped between the jaws 32 and 34. The position of the second jaw 34 is adjustable by moving the sliding plate 28 toward the electrical connector 2 until the second jaw 34 abuts the shell of the electrical connector 2. A pair of slide arms 24 are attached to the main plate 20 to prevent the sliding plate 28 from lifting upward out of the groove in which the sliding plate 28 slides.

Figure 23A:
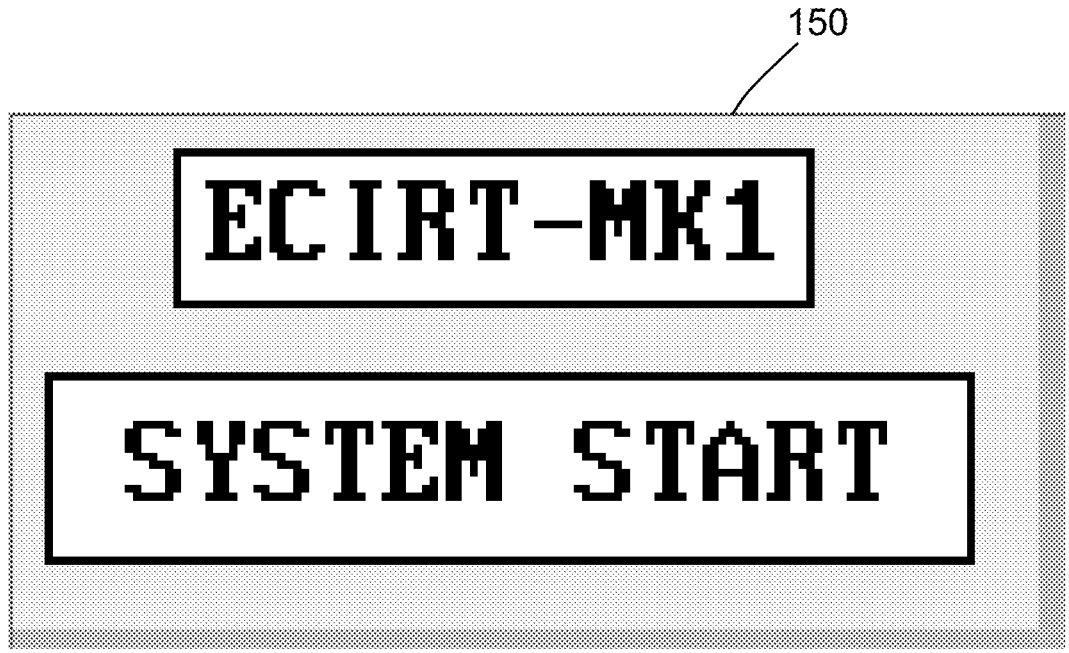
FIGS. 23A through 23D are diagrams representing respective example screenshots displayed on the human-machine interface of the apparatus depicted in FIG. 14.
Figure 23B:
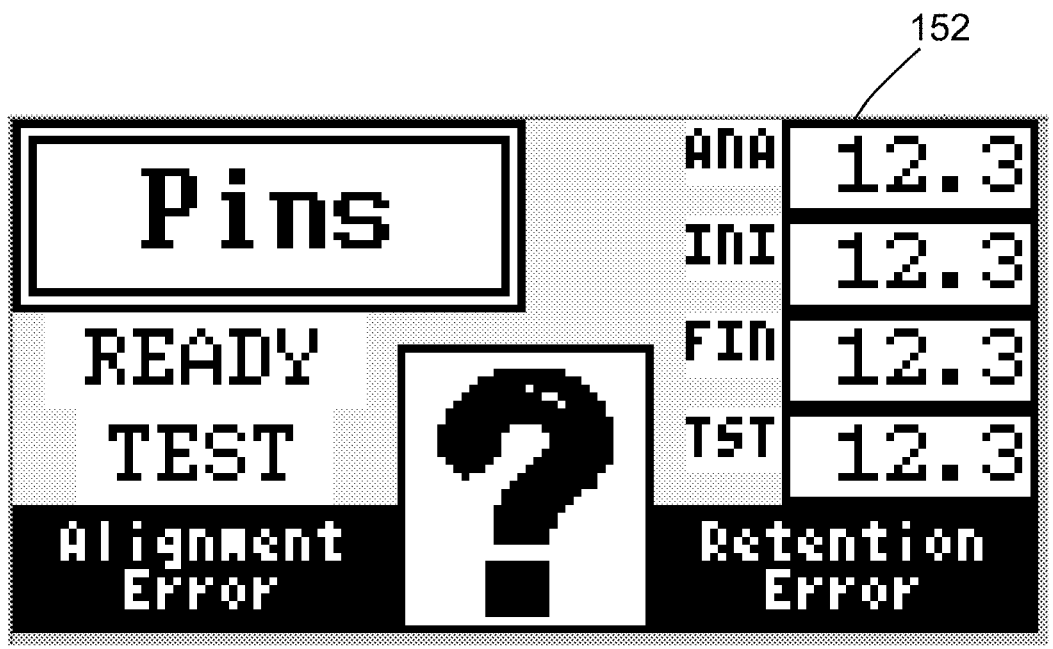
Figure 23C:
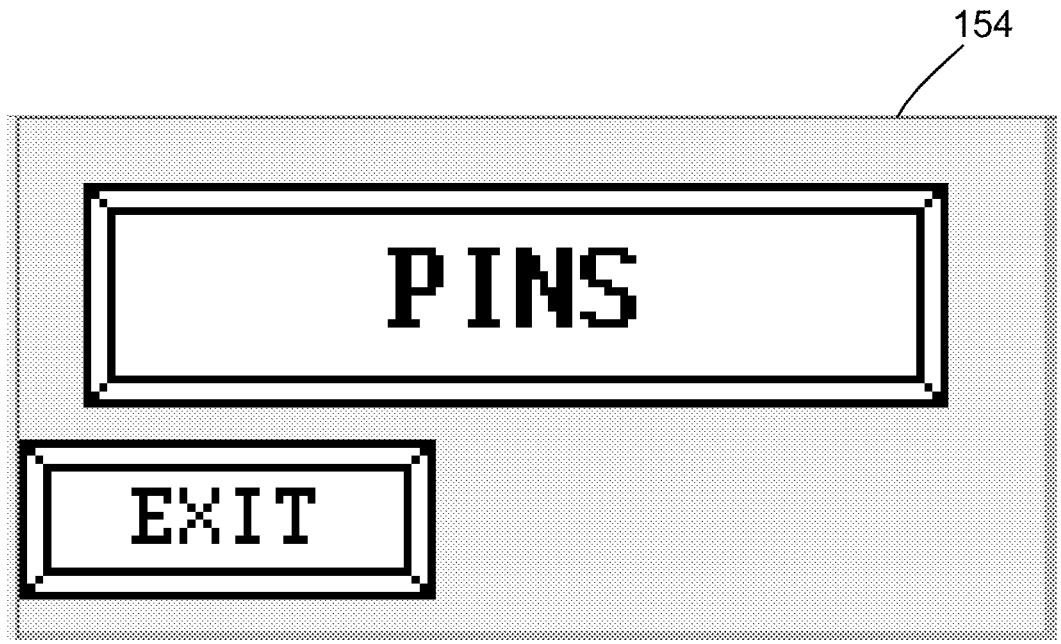
Figure 23D:
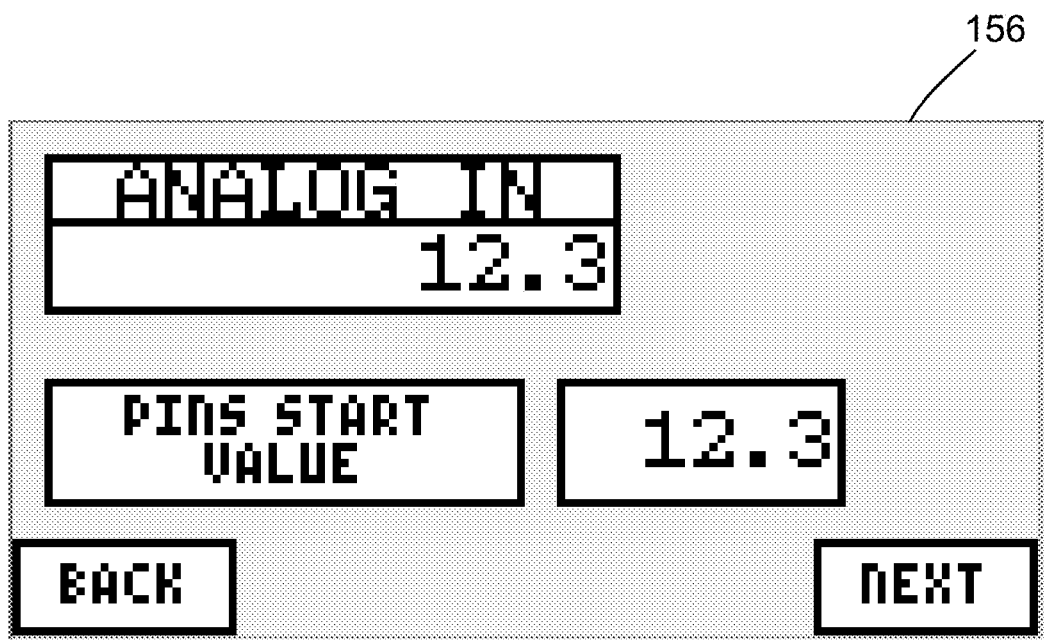

FIGS. 23A through 23D are diagrams representing respective example screenshots displayed on the human-machine interface 74 of the apparatus 10 depicted in FIG. 1. FIG. 23A shows a screenshot 150 wherein the operator starts the system by touching the virtual button named "SYSTEM START". FIG. 23B shows the main operating screen 152. Not all of the fields shown in FIG. 23B are displayed at the same time. The symbol "?" is a warning to manually check the contact. The warnings only appear if the corresponding event has happened. The data on the side is displayed only in a data display mode. FIG. 23C shows a pins/socket selection screen 154. By pressing the main virtual button, the operator can toggle between selecting a program for pin-type contacts and selecting a program for socket-type contacts. FIG. 23D shows a typical maintenance screen 156 for adjusting test and error values.

While apparatus and methods for inserting and retention testing an electrically conductive contact in an electrical connector have been described with reference to various embodiments, it will be understood by those skilled in the art that various changes may be made and equivalents may be substituted for elements thereof without departing from the scope of the teachings herein. In addition, many modifications may be made to adapt the teachings herein to a particular situation without departing from the scope thereof. Therefore it is intended that the claims not be limited to the particular embodiments disclosed herein.

Computer numerical control (CNC) is the automation of machine tools by means of computers executing pre-programmed sequences of machine control commands. Some steps of the methods described herein are encoded as executable instructions embodied in a non-transitory tangible computer-readable storage medium, including, without limitation, a storage device and/or a memory device. Such instructions, when executed by a CNC controller, cause the apparatus to perform at least a portion of the methods described herein.

As used herein, the term "controller" means a computer or processor configured to execute pre-programmed sequences of machine control commands for controlling computer-controlled components of the contact insertion and retention testing apparatus disclosed herein.

The embodiments disclosed above use one or more processing or computing devices. Such devices typically include a processor, processing device, or controller, such as a general-purpose central processing unit, a microcontroller, a reduced instruction set computer processor, an ASIC, a programmable logic circuit, an FPGA, a digital signal processor, and/or any other circuit or processing device capable of executing the functions described herein. The methods described herein may be encoded as executable instructions embodied in a non-transitory tangible computer-readable storage medium, including, without limitation, a storage device and/or a memory device. Such instructions, when executed by a processing device, cause the processing device to perform at least a portion of the methods described herein. The above examples are exemplary only, and thus are not intended to limit in any way the definition and/or meaning of the terms "processor" and "computing device".

The method claims set forth hereinafter should not be construed to require that the steps recited therein be performed in alphabetical order (any alphabetical ordering in the claims is used solely for the purpose of referencing previously recited steps) or in the order in which they are recited unless the claim language explicitly specifies or states conditions indicating a particular order in which some or all of those steps are performed. Nor should the process claims be construed to exclude any portions of two or more steps being performed concurrently or alternatingly unless the claim language explicitly states a condition that precludes such an interpretation.

The invention claimed is:

1. A method for inserting an electrically conductive contact in a hole in an electrical connector, comprising:
   (a) placing an electrical connector underneath an insertion tip and above a test probe;
   (b) coupling a contact to the insertion tip;
   (c) moving the insertion tip until the contact is partially inserted into a hole in the electrical connector;
   (d) moving the test probe toward the electrical connector until an end of the test probe is at a starting position;
   (e) moving the insertion tip to insert the contact further into the hole subsequent to step (d);
   (f) detecting a vertical position of the end of the test probe using a sensor subsequent to step (e);
   (g) outputting sensor data representing the detected vertical position of the end of the test probe from the sensor to a computer;
   (h) determining that the detected vertical position of the end of the test probe as represented by the sensor data is lower in elevation than an alignment check vertical position using a computer, wherein the alignment check vertical position is lower in elevation than the starting position;
   (i) determining that the detected vertical position of the end of the test probe as represented by the sensor data is higher in elevation than a vibration check vertical position using the computer subsequent to step (h), wherein the vibration check vertical position is lower in elevation than the alignment check vertical position; and
   (j) using the computer to activate a vibrator that is vibrationally coupled to the insertion tip by way of a metal rod in response to determining that the detected vertical position of the end of the test probe is higher in elevation than the vibration check vertical position.

2. The method as recited in claim 1, further comprising:
   using the computer to deactivate an insertion cylinder that is coupled to the insertion tip;
   using the computer to activate a test cylinder that is coupled to the test probe; and
   using the computer to determine whether the detected vertical position of the end of the test probe is lower than an insertion failure vertical position in response to determining that the detected vertical position of the end of the test probe is lower in elevation than the vibration check vertical position, wherein the insertion failure vertical position is lower in elevation than the vibration check vertical position, and wherein the insertion and test cylinders are respective pneumatic cylinders.

3. The method as recited in claim 2, further comprising displaying symbology on a human-machine interface indicating a contact retention test failure in response to determining that the detected vertical position of the end of the test probe is higher in elevation than the insertion failure vertical position.

4. The method as recited in claim 2, further comprising displaying symbology on a human-machine interface indicating a contact retention test success in response to determining that the vertical position of the end of the test probe is lower in elevation than the insertion failure vertical position.

5. The method as recited in claim 1, wherein step (e) comprises using the computer to activate a first pneumatic cylinder that is coupled to the insertion tip.

6. The method as recited in claim 5, wherein a first pneumatic valve opens in response to the first control signal to allow flow of compressed air from a main air supply to the first pneumatic cylinder.

7. The method as recited in claim 6, further comprising using the computer to deactivate the first pneumatic cylinder, using the computer to activate a second pneumatic cylinder that is coupled to the test probe, and determining that the detected vertical position of the end of the test probe as represented by the sensor data is lower in elevation than an insertion failure vertical position using the computer in response to determining that the end of the test probe is lower in elevation than the vibration check vertical position, wherein the insertion failure vertical position is lower in elevation than the vibration check vertical position.

8. The method as recited in claim 7, further comprising displaying symbology on a human-machine interface indicating a contact retention test failure in response to determining that the detected vertical position of the end of the test probe is higher in elevation than the insertion failure vertical position.

9. The method as recited in claim 5, further comprising using the computer to deactivate the first pneumatic cylinder, using the computer to activate a second pneumatic cylinder that is coupled to the test probe, and determining that the detected vertical position of the end of the test probe as represented by the sensor data is lower in elevation than an insertion failure vertical position using the computer in response to determining that the end of the test probe is lower in elevation than the vibration check vertical position, wherein the insertion failure vertical position is lower in elevation than the vibration check vertical position.

10. The method as recited in claim 9, further comprising displaying symbology on a human-machine interface indicating a contact retention test failure in response to determining that the detected vertical position of the end of the test probe is higher in elevation than the insertion failure vertical position.

* * * * *